(12) United States Patent
Okamura et al.

(10) Patent No.: US 7,633,214 B2
(45) Date of Patent: Dec. 15, 2009

(54) MULTI-LAYER PIEZOELECTRIC ELEMENT

(75) Inventors: Takeshi Okamura, Kirishima (JP); Katsushi Sakaue, Kirishima (JP); Shigenobu Nakaumra, Kirishima (JP)

(73) Assignee: Kyocera Corporation, Kyoto (JP)

( * ) Notice: Subject to any disclaimer, the term of this patent is extended or adjusted under 35 U.S.C. 154(b) by 178 days.

(21) Appl. No.: 10/573,331

(22) PCT Filed: Sep. 22, 2004

(86) PCT No.: PCT/JP2004/013844

§ 371 (c)(1),
(2), (4) Date: Feb. 1, 2007

(87) PCT Pub. No.: WO2005/029603

PCT Pub. Date: Mar. 3, 2005

(65) Prior Publication Data

US 2007/0273251 A1 Nov. 29, 2007

(30) Foreign Application Priority Data

Sep. 24, 2003 (JP) ............................. 2003-332020
Nov. 14, 2003 (JP) ............................. 2003-385370
Dec. 18, 2003 (JP) ............................. 2003-421146

(51) Int. Cl.
*H01L 41/047* (2006.01)
*H01L 41/18* (2006.01)

(52) U.S. Cl. ...................................... 310/363; 310/364
(58) Field of Classification Search ......... 310/363–366, 310/328
See application file for complete search history.

(56) References Cited

U.S. PATENT DOCUMENTS

| 4,977,485 | A | 12/1990 | Mori et al. |
| 5,163,209 | A | 11/1992 | Harada et al. |
| 6,208,026 | B1 * | 3/2001 | Bindig et al. ............... 257/718 |
| 6,381,118 | B1 | 4/2002 | Yokoyama et al. |
| 6,414,417 | B1 * | 7/2002 | Tsuyoshi et al. ............ 310/366 |
| 6,507,140 | B1 | 1/2003 | Heinz et al. |
| 6,700,311 | B2 | 3/2004 | Hammer et al. |

(Continued)

FOREIGN PATENT DOCUMENTS

CN 1435899 A 8/2003

(Continued)

OTHER PUBLICATIONS

European Search Report for corresponding European application No. 04788027.3-2222 lists the references above.

(Continued)

*Primary Examiner*—Walter Benson
*Assistant Examiner*—Derek J Rosenau
(74) *Attorney, Agent, or Firm*—Hogan & Hartson LLP

(57) ABSTRACT

A multi-layer piezoelectric element having excellent durability in which the amount of displacement does not change even after subjecting to continuous operation over a long period of time under a high voltage and a high pressure is provided. The multi-layer piezoelectric element comprises a stack formed by stacking piezoelectric layers and internal electrodes alternately one on another and external electrodes the proportion of silver contained in electrically conductive material of the internal electrode near the junction with the external electrode is higher than the proportion of silver contained in electrically conductive material of the internal electrode located inside of the stack.

26 Claims, 9 Drawing Sheets

U.S. PATENT DOCUMENTS

| | | |
|---|---|---|
| 6,734,607 B2 | 5/2004 | Nagaya et al. |
| 6,756,720 B2 | 6/2004 | Sakai |
| 6,888,290 B2 | 5/2005 | Murai et al. |
| 2001/0043454 A1* | 11/2001 | Yoshii et al. .............. 361/321.2 |
| 2001/0054859 A1 | 12/2001 | Hammer et al. |
| 2002/0043901 A1* | 4/2002 | Kihara et al. ................ 310/366 |
| 2002/0084872 A1* | 7/2002 | Kawazoe .................... 333/186 |
| 2002/0150508 A1 | 10/2002 | Nagaya et al. |
| 2002/0158552 A1* | 10/2002 | Nakamura et al. .......... 310/328 |
| 2003/0080651 A1 | 5/2003 | Murai et al. |
| 2003/0141786 A1 | 7/2003 | Sakai |

FOREIGN PATENT DOCUMENTS

| | | |
|---|---|---|
| EP | 0354353 A1 | 2/1990 |
| GB | 2258084 A | 1/1993 |
| JP | 60-099522 | 7/1985 |
| JP | 61-133715 | 6/1986 |
| JP | 2000-077733 | 3/2000 |
| JP | 2001-342062 | 12/2002 |
| JP | 2003197991 A | 7/2003 |
| JP | 2004103623 A | 4/2004 |
| JP | 2005072325 A | 3/2005 |
| WO | 0193345 A1 | 12/2001 |

OTHER PUBLICATIONS

English translation of Chinese office action for corresponding Chinese application No. 200480027657.1 lists the references above.

English translation of Chinese office action for corresponding Chinese application No. 200480027658.6 lists the references above.

Borland, et al. "High conductivity materials systems for advanced hybrids" IEEE Conference Proceedings Article, pp. 704-713, May 22, 1989.

European search report for corresponding European application 08019381.6 lists the references above.

* cited by examiner

MULTI-LAYER PIEZOELECTRIC ELEMENT

Cross-Reference to the Related Application

This application is a national phase of international application No. PCT/JP2004/013844 filed Sep. 22, 2004, the entire contents of which are incorporated by reference. This application also claims benefit of priority under 35 U.S.C. § 119 to Japanese Patent Application No. 2003-332020 filed Sep. 24, 2003, Japanese Patent Application No. 2003-385370 filed Nov. 14, 2003 and Japanese Patent Application No. 2003-421146 filed Dec. 18, 2003, the entire contents of all of which are incorporated by reference.

TECHNICAL FIELD

The present invention relates to a multi-layer piezoelectric element used for fuel injection apparatus of automobile engine, liquid injection apparatus of ink jet printer or the like or a drive unit used in precision positioning device or vibration preventing device for an optical apparatus, and to a multi-layer piezoelectric element used as a sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like.

BACKGROUND ART

Multi-layer piezoelectric actuators 53 constituted from piezoelectric layers and electrodes stacked alternately one on another have been known as an example of the multi-layer piezoelectric element. The multi-layer piezoelectric actuators 53 can be divided into two categories: fired-at-once type and stacked type where piezoelectric porcelain and internal electrode sheet are stacked one on another alternately. When the requirements to reduce the voltage and manufacturing cost are taken into consideration, the multi-layer piezoelectric actuator 53 of fired-at-once type is more advantageous for the reason of smaller layer thickness and higher durability.

FIG. 9 shows a multi-layer capacitor as a typical multi-layer electronic component of the prior art, which is constituted from a dielectric material 21 and internal electrodes 22 stacked alternately. The internal electrode 22 is not formed over the entire principal surface of the dielectric material 21, but is formed in a so-called partial electrode structure. The internal electrode 22 having the partial electrode structure is placed in every other layer in a staggered manner, so that the internal electrodes 22 are connected to external electrodes 23, that are formed on the side faces of the multi-layer electronic component, alternately in every other layer (refer, for example, to Patent Document 1).

FIG. 8A shows a multi-layer piezoelectric element of the prior art, which is constituted from piezoelectric layers 11 and internal electrodes 12 stacked alternately one on another. As shown in FIG. 8A and FIG. 8B, the internal electrode 12 is not formed over the entire principal surface of the piezoelectric layer 11, but is formed in a so-called partial electrode structure. The internal electrodes 12 having the partial electrode structure are stacked in a staggered manner, so that the internal electrodes 12 are connected to external electrodes 15, that are formed on the side faces of the multi-layer electronic component, alternately in every other layer. Fundamental structure of the multi-layer piezoelectric element is the same as that of the multi-layer capacitor shown in FIG. 9, and is manufactured by printing a paste for the internal electrode in a predetermined pattern on a ceramic green sheet stacking a plurality of the green sheets having the paste for the internal electrode printed thereon, and firing the stack (refer, for example, to Patent Document 2).

The multi-layer piezoelectric element comprises a column-shaped stack 13 formed by stacking the piezoelectric layers 11 and the internal electrodes 12 alternately. Placed on both ends in the direction of stacking are inactive layers 14. The internal electrodes 12 are formed so as to be electrically connected to the external electrode 15 at the end on the right hand side in one layer and at the left hand side in the next layer. When the multi-layer piezoelectric element is used as the multi-layer piezoelectric actuator, the external electrodes 15 are further provided with lead wires fastened thereto by soldering.

The internal electrode is formed from an alloy of silver and palladium and, in order to fire the piezoelectric material and the internal electrode at the same time, composition of metals contained in the internal electrode is set to 70% by weight of silver and 30% by weight of palladium (refer to, for example, Patent Document 3).

This composition has been employed because the composition of 70% by weight of silver and 30% by weight of palladium corresponds to a temperature of 11500° C. on solidus and a temperature of 1220° C. on liquidus, and a piezoelectric material consisting mainly of perovskite type oxide such as $PbZrO_3$—$PbTiO_3$ can be sintered optimally a temperature around 1200° C.

The internal electrode is made of the metal composition that contains silver-palladium alloy instead of 100% silver because, when a voltage is applied between the pair of opposing internal electrodes that are made of silver without palladium content, the so-called silver migration occurs in which silver atoms of the pair of internal electrodes propagate along the device surface from the positive electrode to the negative electrode. Silver migration occurs particularly conspicuously in an atmosphere of high temperature and high humidity.

In recent years, since it is required to make a compact multi-layer piezoelectric actuators capable of achieving a large amount of displacement under a high pressure, continuous operation is carried out over a long period of time with a higher electric field applied.

Patent document 1: Japanese Unexamined Utility Model Publication (Kokai) No. 60-99522

Patent document 2: Japanese Unexamined Patent Publication (Kokai) No. 61-133715

Patent document 3: Japanese Unexamined Utility Model Publication (Kokai) No. 1-130568

DISCLOSURE OF THE INVENTION

Problems to be Solved by the Invention

In the prior art, there has been such a problem that the amount of displacement of a piezoelectric actuator varies as the device temperature rises, because of the temperature dependency of the piezoelectric material that means the amount of displacement changes with the ambient temperature. A change in the amount of displacement during operation of the actuator, in turn, causes fluctuation in the load on the power source that supplies the voltage, thus placing a burden on the power source. When the amount of displacement undergoes a rapid change, the amount of displacement deteriorates rapidly. When the heat generated by the device exceeds the heat that can be removed by dissipation, thermal excursion occurs, resulting in breakage and failure.

To counter this problem, it has been attempted to form the internal electrode having a lower specific resistance by increasing the proportion of silver in the composition, although this makes it difficult to form the electrode of dense structure, resulting in a higher resistance contrary to the intention.

Composition of 70% by weight of silver and 30% by weight of palladium that has been used in the multi-layer piezoelectric element of the prior art results in a high resistivity 1.5 times that of palladium. On top of this, when the density of sintered internal electrode becomes lower, resistance of the electrode becomes even higher.

When the conventional multi-layer piezoelectric element is used as an actuator, there is a problem that the amount of displacement gradually changes resulting in malfunction of the apparatus. Therefore, it has been called for to suppress the amount of displacement from changing and improve durability during continuous operation over a long period.

The present invention has been made to solve the problems described above, and has an object of providing a multi-layer piezoelectric element having excellent durability in which the amount of displacement does not change even when the piezoelectric actuator is subjected to continuous operation over a long period of time under a high voltage and a high pressure.

Means for Solving the Problems

The multi-layer piezoelectric element of the present invention comprises a stack formed by stacking piezoelectric layers and internal electrodes alternately one on another and external electrodes formed on a first side face and on a second side face of the stack, wherein one of the adjacent internal electrodes is connected to the external electrode formed on the first side face and the other internal electrode is connected to the external electrode formed on the second side face, while the metal composition contained in the internal electrodes contains group VIII metal and group Ib metal of the periodic table as the main components, and contents of the group VIII metal and the group Ib metal are set so that proportion $M1$ (% by weight) of the group VIII metal and proportion $M2$ of the group Ib metal satisfy the relations $0 < M1 \leq 15$, $85 \leq M2 < 100$ and $M1 + M2 = 100$.

With the multi-layer piezoelectric element of the present invention having the constitution described above, since the specific resistance of the internal electrode can be made lower, generation of heat from the internal electrode can be suppressed even when operated continuously. Moreover, since the amount of displacement of the piezoelectric actuator can be stabilized by suppressing the device temperature from increasing, piezoelectric actuator having excellent durability and high reliability even in an atmosphere of high temperature and high humidity can be provided. At the same time, a piezoelectric actuator having excellent durability and high reliability even in an atmosphere of high temperature and high humidity without causing silver migration even when operated continuously can be provided.

Also because it is made possible to provide piezoelectric actuator having excellent durability and high reliability without malfunction and thermal excursion, since the amount of displacement is kept substantially constant by suppressing the device temperature from increasing.

It is preferable that the group VIII metal used in the multi-layer piezoelectric element of the present invention is at least one kind selected from among Ni, Pt, Pd, Rh, Ir, Ru and Os, and the Ib metal is at least one kind selected from among Cu, Ag and Au.

This makes it possible to use either an alloy or a mixed powder as the material to form the internal electrode and make the specific resistance of the internal electrode lower, so that heat generation from the internal electrode can be suppressed even when operated continuously. Moreover, the amount of displacement of the piezoelectric actuator can be stabilized by suppressing the device temperature from increasing, and a piezoelectric actuator having excellent durability and high reliability can be provided.

It is also preferable that the group VIII metal used in the multi-layer piezoelectric element of the present invention is at least one kind selected from among Pt and Pd, and the Ib metal is at least one kind selected from among Ag and Au, because such a composition enables it to form the electrode having excellent heat resistance and decrease the specific resistance of the internal electrode, so that heat generation from the internal electrode can be suppressed even when operated continuously. Moreover, since the amount of displacement of the piezoelectric actuator can be stabilized by suppressing the device temperature from increasing, the piezoelectric actuator having excellent durability and high reliability can be provided.

In such a multi-layer piezoelectric element as described above, such an electrode can be formed that mitigates the stress generated by the displacement during operation and is excellent in heat resistance, in oxidation resistance and in heat conductivity, while specific resistance of the internal electrode can be made lower thus making it possible to suppress the heat generation from the internal electrode even when operated continuously. Moreover, since the amount of displacement of the piezoelectric actuator can be stabilized by suppressing the device temperature from increasing, the piezoelectric actuator having excellent durability and high reliability can be provided.

The group Ib metal used in the multi-layer piezoelectric element of the present invention is more preferably Cu. This makes it possible to form an electrode having excellent heat conductivity and low specific resistance of the internal electrode, thus making it possible to suppress the heat generation from the internal electrode even when operated continuously. Moreover, since the amount of displacement of the piezoelectric actuator can be stabilized by suppressing the device temperature from increasing, the piezoelectric actuator having excellent durability and high reliability can be provided.

In the multi-layer piezoelectric element of the present invention, it is preferable that specific resistance of the device is higher than the resistance $\rho Ag$ of the device having the internal electrode of which metallic component consists solely of silver, and is lower than the resistance $\rho Pd$ of the device having the internal electrode of which metallic component consists solely of palladium.

In such a multi-layer piezoelectric element as described above, an electrode that is excellent in heat resistance and has low specific resistance of the device can be made, thus making it possible to suppress the heat generation from the internal electrode even when operated continuously. Moreover, since the amount of displacement of the piezoelectric actuator can be stabilized by suppressing the device temperature from increasing, the piezoelectric actuator having excellent durability and high reliability can be provided.

The multi-layer piezoelectric element of the present invention comprises a stack formed by stacking piezoelectric layers and internal electrodes alternately one on another and external electrodes formed on a first side face and on a second side face of the stack, wherein one of the adjacent internal electrodes is connected to the external electrode formed on the first side face and the other internal electrode is connected to the external electrode formed on the second side face, while the electric resistance of the device is higher than the resistance ρAg of the device having the internal electrode of which metallic component consists solely of silver, and is lower than the resistance ρPd of the device having the internal electrode of which metallic component consists solely of palladium.

With such a multi-layer piezoelectric element having the constitution described above, an electrode that is excellent in heat resistance can be made and the specific resistance of the device can be made lower, thus making it possible to suppress the heat generation from the internal electrode even when operated continuously. Moreover, since the amount of displacement of the piezoelectric actuator can be stabilized by suppressing the device temperature from increasing, the piezoelectric actuator having excellent durability and high reliability can be provided.

In the multi-Layer piezoelectric element of the present invention, it is preferable that 80% by volume or more of crystal grains formed from the metallic component that constitutes the internal electrode have particle size of 1 μm or larger. With such a multi-layer piezoelectric element having the constitution described above, an electrode that is excellent in heat resistance and has low specific resistance of the device can be made, thus making it possible to suppress the heat generation from the internal electrode even when operated continuously. Moreover, since the amount of displacement of the piezoelectric actuator can be stabilized by suppressing the device temperature from increasing, the piezoelectric actuator having excellent durability and high reliability can be provided.

In the multi-layer piezoelectric element of the present invention, an inorganic component may be contained along with the metallic component in the internal electrode. In the multi-layer piezoelectric element having the internal electrode that contains the inorganic component added thereto, the internal electrode and the piezoelectric material can be firmly bonded with each other, and the heat generation from the internal electrode can be suppressed even when operated continuously. Moreover, since the amount of displacement of the piezoelectric actuator can be stabilized by suppressing the device temperature from increasing, the piezoelectric actuator having excellent durability and high reliability can be provided.

It is preferable that the inorganic component contains perovskite type oxide consisting of $PbZrO_3$—$PbTiO_3$ as the main component. This makes it possible to bond the internal electrode and the piezoelectric material more firmly with each other, and the heat generation from the internal electrode can be suppressed even when operated continuously. Moreover, since the amount of displacement of the piezoelectric actuator can be stabilized by suppressing the device temperature from increasing, the piezoelectric actuator having excellent durability and high reliability can be provided.

In the multi-layer piezoelectric element of the present invention, it is preferable that the piezoelectric material contains perovskite type oxide as the main component. This constitution makes it possible to fire the internal electrode and the piezoelectric material at the same time, while achieving lower specific resistance of the internal electrode. As a result, the heat generation from the internal electrode can be suppressed even when operated continuously. Moreover, since the amount of displacement of the piezoelectric actuator can be stabilized by suppressing the device temperature from increasing, the piezoelectric actuator having excellent durability and high reliability can be provided.

It is also preferable that the piezoelectric material contains perovskite type oxide consisting of $PbZrO_3$—$PbTiO_3$ as the main component. This constitution increases the amount of displacement of the multi-layer piezoelectric element, while achieving lower specific resistance of the internal electrode. As a result, the heat generation from the internal electrode can be suppressed even when operated continuously. Moreover, since the amount of displacement of the piezoelectric actuator can be stabilized by suppressing the device temperature from increasing, the piezoelectric actuator having excellent durability and high reliability can be provided.

The temperature of firing the stack is preferably in a range from 900 to 1000° C. This results in firm bonding of the piezoelectric material and the electrode, thus making it possible to provide the piezoelectric actuator having excellent durability and high reliability.

The multi-layer piezoelectric element of the present invention is characterized by the deviation in the composition of the internal electrode that is caused by the firing operation being not larger than 5%. This suppresses the electrode from stiffening, and therefore the piezoelectric actuator having excellent durability and high reliability can be provided.

In the multi-layer piezoelectric element of the present invention, it is preferable that the external electrode is formed from an electrically conductive material consisting mainly of silver and glass, and that proportions of silver contained in the internal electrode and the external electrode are set so that the proportion X (% by weight) of silver contained in the electrically conductive material as a whole and the proportion Y (% by weight) of silver to the total weight of the electrically conductive material and glass contained in the external electrode satisfy conditions of $X \geq 85$ and $0.9 \geq X/Y \geq 1.1$. Such a silver content reduces the use of expensive palladium and makes it possible to manufacture the multi-layer piezoelectric element at a lower cost.

Also because the weight proportion of silver in the electrically conductive material that constitutes the internal electrode and the weight proportion of silver in the external electrode become substantially equal, cross diffusion of silver in the external electrode and silver in the internal electrode is accelerated when the external electrode is bonded by baking onto the stack. This enables it to firmly join the internal electrode and the external electrode, so that excellent durability is achieved such that the internal electrode and the external electrode do not break even when operated continuously over a long period of time under high electric field and high pressure.

In the multi-layer piezoelectric element of the present invention, it is also preferable that the internal electrode contains piezoelectric material, and that the proportion z (% by weight) of silver to the total weight of the internal electrode containing the piezoelectric material satisfies condition of $0.7 \leq Z/Y \leq 1.0$.

Containing the piezoelectric material in the internal electrode causes the electrically conductive material contained in the internal electrode and the piezoelectric material to be sintered together during firing, resulting in an improvement of the bonding strength between the internal electrode and the piezoelectric material and in improvement in the durability of the stack. Also because the weight proportion of silver Z (%) satisfies the condition $0.7 \leq Z/Y \leq 1.0$, the weight proportion of silver in the internal electrode and the weight proportion of silver in the external electrode become substantially equal, so that cross diffusion of silver contained in the external electrode and silver contained in the internal electrode is accelerated when the external electrode is bonded by baking, thus enabling firm joining of the internal electrode and the external electrode. As a result, joint between the internal electrode and the external electrode can be prevented from breaking even when operated at a high speed.

In the multi-layer piezoelectric element of the present invention, it is also preferable that the external electrode is formed from a porous electrically conductive material that has 3-dimensional mesh structure. Since the external electrode formed from a porous electrically conductive material that has 3-dimensional mesh structure is flexible in nature, the external electrode can deform in conformity with the expansion and contraction of the stack in the direction of stacking during operation, thus making it possible to prevent the external electrode from breaking and contact failure from taking place between the internal electrode and the external electrode.

In the multi-layer piezoelectric element of the present invention, it is also preferable that void ratio of the external electrode is in a range from 30 to 70% by volume. When void ratio of the external electrode is in a range from 30 to 70% by volume, stress generated by the expansion and contraction of the stack during operation can be absorbed so that the external electrode can be prevented from breaking.

The multi-layer piezoelectric element of the present invention is characterized in that the softening point (° C.) of the glass used in the external electrode is not higher than $4/5$ of the melting point (° C.) of the electrically conductive material that constitutes the internal electrode. When the softening point (° C.) of the glass and is not higher than $4/5$ of the melting point (° C.) of the electrically conductive material that constitutes the internal electrode, the external electrode can be bonded by baking at a temperature sufficiently lower than the melting point of the electrically conductive material that constitutes the internal electrode and is higher than the softening point of the glass. This makes it possible to prevent the electrically conductive material in the internal electrode and in the external electrode from coagulating, and cause the electrically conductive material contained in the internal electrode and the electrically conductive material contained in the external electrode to join through sufficient diffusion, so that strong bonding can be achieved by the softened glass.

In the multi-layer piezoelectric element of the present invention, it is also preferable that the glass that constitutes the external electrode is amorphous. When the glass that constitutes the external electrode is amorphous, it has Young's modulus lower than that of a crystalline material and therefore cracks or other defects can be suppressed from occurring in the external electrode.

In the multi-layer piezoelectric element of the present invention, it is also preferable that thickness of the external electrode is smaller than that of the piezoelectric layer that constitutes the stack. When the external electrode is formed with a small thickness, hardness becomes lower and the load on the joint between the internal electrode and the external electrode can be decreased when the stack expands or contracts during operation, thus making it possible to suppress contact failure from occurring in the joint.

In the multi-layer piezoelectric element of the present invention, it is preferable that the internal electrodes are made of an electrically conductive material that contains silver as the main component and at least one of palladium and platinum as well, and the proportion of silver contained in electrically conductive material of the internal electrode near the junction with the external electrode is higher than the proportion of silver contained in electrically conductive material of the internal electrode located inside of the stack.

Such a constitution makes the connection between the electrically conductive material of the internal electrode and the electrically conductive material of the external electrode secure and strong, thus preventing such a problem from occurring as the internal electrode and the external electrode come off at the junction thereof, even when operated continuously under a high electric field.

That is, as the proportion of silver contained in the electrically conductive material of the internal electrode near the junction with the external electrode is set higher than the proportion of silver contained inside of the stack in order to form a firm joint with the electrically conductive material of the external electrode that is formed mainly from silver, concentration of silver as the main component of the electrically conductive material of the external electrode and concentration of silver in electrically conductive material of the internal electrode can be approximate to each other, thus making the junction between the internal electrode and the external electrode more secure through cross diffusion of silver.

In other words, since concentration of silver in the electrically conductive material of the external electrode and concentration of silver in the electrically conductive material of the internal electrode in a region near the junction with the external electrode are made approximately equal to each other, cross diffusion of silver contained in the external electrode and silver contained in the internal electrode is accelerated when the external electrode is bonded by baking onto the stack. This enables it to firmly join the internal electrode and the external electrode, so that excellent durability is achieved such that the internal electrode and the external electrode do not break even when operated continuously over a long period of time under high electric field and high pressure.

In the multi-layer piezoelectric element of the present invention, it is preferable that the proportion of silver contained in electrically conductive material of the internal electrode becomes higher toward the external electrode. Since this arrangement results in a gradient of silver concentration that varies continuously toward the external electrode, stable internal electrode and junction of internal electrode and the external electrode can be achieved.

In the multi-layer piezoelectric element of the present invention, it is preferable that the proportion of silver contained in the electrically conductive material of the internal electrode is 85% by weight or higher. When the proportion of silver contained in the electrically conductive material of the internal electrode is 85% by weight or higher, the junction thereof with the external electrode can be made more secure through the diffusion of silver promoted by the high concentration of silver. The proportion of silver contained in the electrically conductive material of the internal electrode refers to the proportion of silver within the stack where the proportion of silver contained in the internal electrode does not vary.

In the multi-layer piezoelectric element of the present invention, it is preferable that the glass component contained in the external electrode exists in a region substantially not more than 80% in thickness of the external electrode on the side of the surface of the stack. This results in such a constitution of the external electrode that there is the electrically conductive material that contains silver as the main component only on the surface of the external electrode exposed to the atmosphere, thereby providing the external electrode surface that is satisfactorily wetted by solder when a lead wire is soldered onto the external electrode.

In the multi-layer piezoelectric element of the present invention, it is also preferable that the glass component contained in the external electrode contains lead oxide or bismuth oxide. The external electrode can be joined more firmly with the piezoelectric material when the glass component of the external electrode contains lead oxide or bismuth oxide.

In the multi-layer piezoelectric element of the present invention, it is preferable that the electrically conductive material of the internal electrode diffuses into the external electrode so as to form a neck in the joint between the internal electrode and the external electrode. Formation of the neck enables it to prevent spark or breakage from occurring in the joint between the internal electrode and the external electrode even when the device is operated at a high speed with a large electric current.

The multi-layer piezoelectric element of the present invention is characterized by the fact that a glass-rich layer is formed on the surface of the external electrode on the side thereof facing the piezoelectric layer. Formation of the glass-rich layer improves the strength of joining the external electrode and the stack because much of the glass component of the external electrode can be located in the interface with the piezoelectric layer.

Moreover, in the multi-layer piezoelectric element of the present invention, it is preferable that the internal electrode contains voids and the voids occupy 5 to 70% of cross sectional area of the internal electrode. This decreases the restriction exercised by the internal electrode on the deformation of the piezoelectric material under the effect of electric field, thereby increasing the amount of displacement. It also provides such an advantage that stress generated in the internal electrode is mitigated by the voids, thereby improving the durability of the device. In addition, while heat transfer within the device is predominantly carried by the internal electrode, existence of the voids in the internal electrode mitigates the change in temperature within the device caused by rapid changes in the temperature outside of the device, thus making the device more resistant to thermal shock.

In the multi-layer piezoelectric element of the present invention, such a constitution may also be employed as a groove is formed between the end of the other internal electrode and the external electrode on the first side face, with the groove being filled with an insulating material so as to insulate between the other internal electrode and the external electrode, while a groove is formed between the end of the one internal electrode and the external electrode on the second side face, with the groove being filled with an insulating material so as to insulate between the one internal electrode and the external electrode. This constitution enables it to insulate the internal electrode and the external electrode alternately in every other layer. In this case, it is preferable that the insulating material has Young's modulus lower than that of the piezoelectric material. In the multi-layer piezoelectric element having such a constitution, since the stress generated by the displacement during operation can be mitigated, generation of heat from the internal electrode can be suppressed even when operated continuously. Moreover, since the amount of displacement of the piezoelectric actuator can be stabilized by suppressing the device temperature from increasing, the piezoelectric actuator having excellent durability and high reliability can be provided. Moreover, since the insulating material provided in the groove can deform in conformity with the expansion and contraction of the stack during operation, crack and other defects can be prevented from occurring in the vicinity of the groove.

The multi-layer piezoelectric element of the present invention may also have an electrically conductive assisting member formed from an electrically conductive adhesive, containing a metal mesh or a mesh-like metal sheet embedded therein, on the external surface of the external electrode.

By providing the electrically conductive assisting member formed from an electrically conductive adhesive, containing a metal mesh or a mesh-like metal sheet embedded therein, on the external surface of the external electrode, it is made possible to cause a large current to flow in the electrically conductive assisting member when the device is operated at a high speed with a large current, so as to prevent the external electrode from breaking due to localized heat generation and greatly improve durability.

By embedding the metal mesh or a mesh-like metal sheet in the electrically conductive adhesive, it is made possible to prevent the electrically conductive adhesive from cracking due to expansion and contraction of the stack during operation.

In the multi-layer piezoelectric element of the present invention, it is preferable that electrically conductive adhesive is polyimide resin having electrically conductive particles dispersed therein. When polyimide resin having electrically conductive particles dispersed therein is used as the electrically conductive adhesive, the electrically conductive adhesive can maintain high bonding strength even when the stack is operated at a high temperature.

In the multi-layer piezoelectric element of the present invention, it is preferable that the electrically conductive particles contained in the electrically conductive adhesive are silver particles. When the electrically conductive particles contained in the electrically conductive adhesive are silver particles, resistance of the electrically conductive adhesive can be made lower, so that local heat generation can be prevented from occurring even when the stack is operated with a large current.

EFFECT OF THE INVENTION

The present invention is capable of providing a multi-layer piezoelectric element having excellent durability in which the amount of displacement does not change even when the piezoelectric actuator is subjected to continuous operation over a long period of time under a high voltage and a high pressure, and providing, for example, an injection apparatus having excellent durability.

BRIEF DESCRIPTION OF THE DRAWINGS

FIG. 5B is an exploded perspective view showing a part of the multi-layer piezoelectric element of FIG. 8A.

DESCRIPTION OF REFERENCE NUMERALS

Figure 1A:
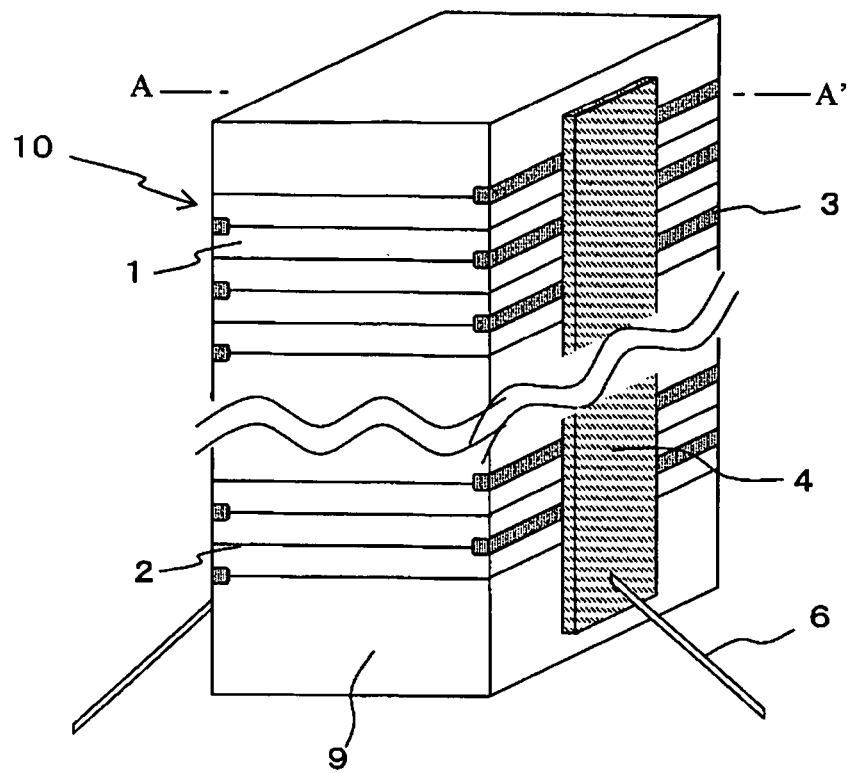
FIG. 1A is a perspective view of a multi-layer piezoelectric element according to first through third embodiments of the present invention.

1: Piezoelectric material
2: Internal electrode
3: Insulating material
4: External electrode
4b: Neck
6: Lead wire
10: Stack
31: Container
33: Injection hole
35: Valve
43: Piezoelectric actuator

MODE FOR CARRYING OUT THE INVENTION

The multi-layer piezoelectric element according to embodiments of the present invention will now be described in detail below with reference to the accompanying drawings.

Embodiment 1

Figure 1B:
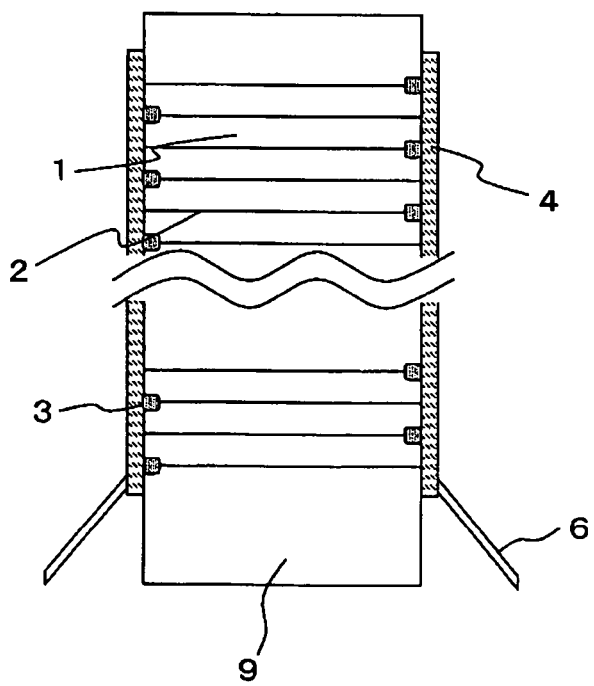
FIG. 1B is a longitudinal sectional view along line A-A' of FIG. 1A.

FIG. 1A is a perspective view of a multi-layer piezoelectric element (multi-layer piezoelectric actuator) according to a first embodiment of the present invention, and FIG. 1B is a longitudinal sectional view along line A-A' of FIG. 1A.

The multi-layer piezoelectric actuator of the first embodiment comprises a stack 10 having rectangular prism shape formed by stacking a plurality of piezoelectric layers 1 and a plurality of internal electrodes 2 alternately and external electrodes 4 formed on the side faces of the stack so as to be connected to the internal electrodes 2 in every other layer, as shown in FIG. 1A and FIG. 1B. Specifically, end of the internal electrode 2 is covered by an insulating material 3 in every other layer on the side face where the external electrode 4 is formed, so that the end face of the internal electrode 2 that is not covered by the insulating material 3 communicates with the external electrode 4. The external electrode 4 is preferably formed from a porous electrically conductive material that has 3-dimensional mesh structure made of an electrically conductive material containing silver as the main component and glass. Portion of the stack 10 identified by reference numeral 9 is an inactive layer wherein the internal electrode 2 is not formed.

While the internal electrode 2 is disposed between the piezoelectric layers 1, the internal electrode 2 is formed from a metallic material such as silver-palladium and is used to apply a predetermined voltage to the piezoelectric layers 1, so that the piezoelectric element undergoes a displacement by the reverse piezoelectric effect according to the magnitude of voltage applied.

Formed on the side face of the stack 10 in every other layer are grooves measuring 30 to 500 μm in depth and 30 to 200 μm in width in the stacking direction. The grooves are filled with glass, epoxy resin, polyimide resin, polyamide-imide resin, silicone rubber or the like that has Young's modulus lower than that of the piezoelectric material 1 so as to form an insulating material 3. The insulating material 3 is preferably a material having a low value of elastic coefficient, particularly silicone rubber or the like, that can deform in conformity with the displacement of the stack 10, in order to make a firm joint with the stack 10.

The external electrodes 4 are connected to the two opposing side faces of the stack 10, and the external electrodes 4 are electrically connected to the internal electrodes 2 that are stacked in every other layer. The external electrodes 4 serve to supply the voltage that is required in common to cause the piezoelectric layers 1 to undergo displacement by the reverse piezoelectric effect, to the internal electrodes 2 that are connected thereto.

Connected to the external electrode 4 is a lead wire 6 by soldering. The lead wire 6 serves to connect the external electrode 4 to an outside power supply.

For the multi-layer piezoelectric actuator of the prior art, such measures have been employed as the device temperature is maintained constant during continuous operation or the drive voltage is carefully controlled in accordance to the device temperature, in order to prevent the amount of displacement of the device during continuous operation from being affected by a change in temperature. Specifically, such a structure is employed as a heat sink that sufficiently dissipates heat is provided, in order to control the drive voltage while monitoring the device temperature or suppress the temperature around the device from changing. According to the first embodiment, in contrast, the device is formed to have low resistance in order to suppress heat generation from the device itself during operation.

Resistance of the device is the resistance of the multi-layer piezoelectric element measured across the external electrodes, and is governed by the resistance of a portion having the highest resistance among the piezoelectric material, the internal electrode, external electrode and the interface therebetween. Resistance of the interface refers to the resistance caused by the energy barrier (similar to schottky barrier of a semiconductor) generated by the difference between the electron energy level that is generated in the grain boundary of the piezoelectric material and the work function of the internal electrode, and is higher than the resistance of the piezoelectric material.

Resistance of the device can be measured by means of an LCR meter, impedance analyzer or the like.

In the first embodiment, temperature of the device is suppressed from rising in order to keep the resistance of the device low, by keeping the specific resistance of the internal electrode at a low level and using a material having excellent heat conductivity as the electrode material.

Specifically, the internal electrodes are formed from a material that has excellent heat conduction characteristic in order to keep the specific resistance of the internal electrode at a low level so as to suppress heat generation due to the resistance of the internal electrode and dissipating heat generated in the device quickly (effectively) to the outside.

It is preferable that the internal electrode reaches as near the surface of the device as possible. Moreover, since it is desirable that temperature dependency of the displacement of the piezoelectric material remains constant regardless of the operating temperature, displacement of the piezoelectric material is preferably small for a change in the device temperature during continuous operation.

In order to decrease the resistance of the device, it is effective to decrease the resistance of the interface, which may be done, for example, by diffusing the material of the internal electrode into the piezoelectric material so as to suppress the formation of energy barrier. For this purpose, Ag is more likely to diffuse than Pd and is effective in decreasing the energy barrier thereby decreasing the resistance in the interface.

In order to decrease the specific resistance of the internal electrode and improve the heat conductivity, it is effective to use a material of lower specific resistance in forming the electrode and form the electrode with high density.

With such considerations, the internal electrode 2 of the multi-layer piezoelectric element according to the first embodiment is constituted from metallic component consisting mainly of the group VIII metal and the group Ib metal. Since the metallic component consisting mainly of the group VIII metal and the group Ib metal has high heat resistance, the piezoelectric material 1 and the internal electrodes 2 can be fired at the same time.

In the first embodiment, such a composition is employed as the proportion M1 (% by weight) of the group VIII metal and proportion M2 (% by weight) of the group Ib metal satisfy the relations $0<M1\leq 15$, $85\leq M2<100$ and $M1+M2=100$.

Proportions of the main metallic components of the internal electrode are set as described above in the first embodiment for the following reason. When the proportion of the group VIII metal is higher than 15% by weight, specific resistance of the internal electrode 2 becomes high which results in heat generation by the internal electrodes 2 when the multi-layer piezoelectric element is operated continuously. In order to prevent the group Ib metal that is contained in the internal electrode 2 from diffusing into the piezoelectric material 1, concentration of the group VIII metal is preferably controlled in a range from 0.001% by weight to 15% by weight. In order to improve the durability of the multi-layer piezoelectric element, concentration of the group VIII metal is preferably in a range from 0.1% by weight to 10% by weight. When high heat conductivity and extra high durability are required, concentration of the group VIII metal is preferably in a range from 0.5% by weight to 9.5% by weight. Moreover, for the maximum durability, concentration of the group VIII metal is preferably in a range from 2% by weight to 8% by weight.

When concentration of the group Ib metal is less than 85% by weight, it leads to a high specific resistance of the internal electrode 2, resulting in heat generation by the internal electrodes 2 when the multi-layer piezoelectric element is operated continuously. In order to prevent the group Ib metal contained in the internal electrode 2 from diffusing into the piezoelectric material 1, concentration of the group Ib metal is preferably in a range from 85% by weight to 99.999% by weight. In order to improve the durability of the multi-layer piezoelectric element, concentration of the group lb metal is preferably in a range from 90% by weight to 99.9% by weight. When extra high durability is required, concentration of the group Ib metal is preferably in a range from 90.5% by weight to 99.5% by weight. Moreover, for the maximum durability, concentration of the group Ib metal is preferably in a range from 92% by weight to 98% by weight.

Concentrations M1 and M2 by weight of the metal components in the internal electrode 2 can be measured by EPMA (Electron Probe Micro Analysis) or the like.

It is preferable that the group VIII metal contained in the internal electrodes 2 of the present invention is at least one kind selected from among Ni, Pt, Pd, Rh, Ir, Ru and Os, and the group Ib metal is at least one kind selected from among Cu, Ag and Au, since such a metal composition is advantageous in volume production when the alloy powder synthesizing technology available today is employed.

According to the first embodiment, it is more preferable that, in the metal components of the internal electrode 2, the group VIII metal is at least one kind selected from among Pt and Pd, and the group Ib metal is at least one kind selected from among Ag and Au. This enables it to form the electrode having better heat resistance and decrease the specific resistance of the internal electrode 2, so that heat generation by the internal electrodes 2 can be suppressed when the multi-layer piezoelectric element is operated continuously.

It is furthermore preferable that the group Ib metal contained in the internal electrode 2 of the first embodiment is Cu.

With such a multi-layer piezoelectric element of the first embodiment having the internal electrodes formed from the materials as described above, the electrode can be formed with excellent heat conductivity, while the specific resistance of the internal electrode 2 can be made lower thus making it possible to suppress the heat generation from the internal electrode 2 even when operated continuously. Moreover, since the amount of displacement of the piezoelectric actuator can be stabilized by suppressing the device temperature from increasing, the piezoelectric actuator having excellent durability and high reliability can be provided.

In the multi-layer piezoelectric element of the first embodiment, the resistance ρ of the device preferably satisfies the relation ρAg<ρ<ρPd, where ρAg is the resistance of the device having the internal electrode of which metallic component consists of 100% silver, and ρPd is the resistance of the device having the internal electrode of which metallic component consists of 100% palladium.

While the internal electrode 2 of the conventional multi-layer piezoelectric element having composition of 70% by weight of silver and 30% by weight of palladium has resistance as high as 1.5 times that of palladium, resistance ρ of the device in the range described above can be achieved by a composition containing 80% by weight or more silver and 20% by weight or less palladium. However, since lower density of the internal electrode 2 after sintering results in higher resistance, it is preferable to increase the proportion of silver content or use a material of lower resistivity to form the electrode. When the electrode is formed by sintering so that large grains are bound together, the internal electrode 2 that is dense and is low in resistance can be formed with sufficient current path secured therein.

In the multi-layer piezoelectric element of the first embodiment, electrical conductivity σ of the internal electrode 2 preferably satisfies the relation σPd<σ<σAg, where σAg is the electrical conductivity of the device having the internal electrode of which metallic component consists of 100% silver, and σPd is the electrical conductivity of the device having the internal electrode of which metallic component consists of 100% palladium.

In the multi-layer piezoelectric element of the present invention, it is preferable that 80% by volume or more of the crystal grains formed from the metallic component that constitutes the internal electrode 2 have grain size of 1 μm or larger.

As the electrode is formed by sintering so that large grains are bound together, the internal electrode 2 that is dense and is low in resistance can be formed with sufficient current path secured therein. Resistance can be made even lower when 90% by volume or more of the crystal grains formed from the metallic component that constitutes the internal electrode have grain size of 1 μm or larger. It is more preferable that 95% by volume or more of the crystal grains formed from the metallic component that constitutes the internal electrode have grain size of 1 μm or larger, in order to decrease the resistance further.

Proportion of grains having size of 1 μm or larger can be determined by identifying the crystal grains having size of 1 μm or larger in the metal composition that constitutes the internal electrode 2 by means of SEM or the like, and converting it to percentage by volume.

It is preferable that the internal electrode 2 of the present invention contains an inorganic component along with the metallic component added therein. This enables the internal electrode 2 and the piezoelectric material 1 to be firmly bonded together.

It is also preferable that the piezoelectric material 1 of the present invention contains perovskite type oxide consisting of $PbZrO_3$—$PbTiO_3$ as the main component. This results in higher piezoelectric strain constant $d_{33}$ which enables it to increase the amount of displacement.

In the multi-layer piezoelectric element of the first embodiment, it is preferable that the piezoelectric material 1 contains perovskite type oxide as the main component. This is because the piezoelectric material 1 formed from perovskite type oxide such as barium titanate ($BaTiO_3$) has high piezoelectric strain constant $d_{33}$ which enables it to increase the amount of displacement. This constitution also enables the piezoelectric element to function better and the internal electrode 2 and the piezoelectric material 1 to be fired at the same time.

It is also preferable that the piezoelectric material 1 of the present invention contains perovskite type oxide consisting of $PbZrO_3$—$PbTiO_3$ as the main component. This results in higher piezoelectric strain constant $d_{33}$ which enables it to increase the amount of displacement.

The temperature of firing the multi-layer piezoelectric element of the present invention is preferably in a range from 900 to 1000° C. This results in firm bonding of the piezoelectric material 1 and the electrode. Firing temperature is restricted within the range from 900 to 1000° C. because a temperature lower than 900° C. makes it impossible to make dense piezoelectric material 1, while a temperature higher than 1000° C. leads to larger stress generated by the difference in contraction between the electrode and the piezoelectric material 1 when fired, thus resulting in cracks occurring during continuous operation.

In the multi-layer piezoelectric element, the deviation in the composition of the internal electrode 2 that is caused by the firing operation is preferably not larger than 5%. This is because a deviation larger than 5% in the composition of the internal electrode 2 caused by the firing operation causes a greater amount of the metallic component contained in the internal electrode 2 to diffuse into the piezoelectric material 1, thus making it impossible for the internal electrode 2 to deform in conformity with the expansion and contraction of the multi-layer piezoelectric element during operation.

The deviation in the composition of the internal electrode 2 refers to the variation in the composition of the internal electrode 2 caused by evaporation of the elements that constitute the internal electrode 2 or diffusion thereof into the piezoelectric material 1.

In the multi-layer piezoelectric element of the first embodiment, the internal electrode 2 of which end is exposed on the side face of the stack and the internal electrode 2 of which end is not exposed are stacked alternately, while a groove is formed in the piezoelectric material located between the internal electrode 2 of which end is not exposed and the external electrode 4. The groove is preferably filled with an insulating material having Young's modulus lower than that of the piezoelectric material 1. In the multi-layer piezoelectric element having the groove filled with an insulating material having low Young's modulus, stress caused by the displacement during operation can be mitigated, thus enabling it to suppress heat generation from the internal electrode 2 even when operated continuously.

The multi-layer piezoelectric element of the present invention is preferably a single plate or a stack of one or more layer. This makes it possible to either transform the pressure applied to the device into voltage or apply a voltage to the device so as to cause a displacement of the device. As a result, even when the device is stressed unexpectedly during operation, the stress can be mitigated by dispersing the stress and transforming it into voltage. Thus the piezoelectric actuator having excellent durability and high reliability can be provided.

The multi-layer piezoelectric element of the present invention is manufactured as described below. In order to make the column-shaped stack 10, first a calcined powder of a piezoelectric ceramic material constituted from perovskite type oxide consisting of $PbZrO_3$—$PbTiO_3$, a binder made of an organic polymer such as acrylic resin or butyral resin and a plasticizer such as DOP (dioctyl phthalate) or DBP (dibutyl phthalate) are mixed to form a slurry which is formed into a ceramic green sheet that would become the piezoelectric material 1 by a known method such as doctor blade process or tape molding method such as calender roll process.

Then a metal powder such as silver-palladium that constitutes the internal electrode, a binder and a plasticizer are mixed to prepare an electrically conductive paste which is applied onto the top surface of the ceramic green sheet by screen printing or the like to a thickness of 1 to 40 μm.

A plurality of the green sheets having the electrically conductive paste printed thereon are stacked one on another, with the stack being heated at a predetermined temperature to remove the binder and fired at a temperature in a range from 900 to 1200° C. thereby to make the column-shaped stack 10. Firing temperature is preferably in a range from 900 to 1000° C.

The method of making the column-shaped stack 10 is not limited to that described above, and any manufacturing method may be employed as long as the column-shaped stack 10 can be made in such a constitution as a plurality of the piezoelectric layers and a plurality of the internal electrodes are stacked alternately one on another.

The stack is formed in such a constitution as (1) one of the two adjacent internal electrodes has one end thereof exposed on one side face where the external electrode is formed, with the other internal electrode is located inside so that the end thereof is not exposed on one side face, and (2) one of the two adjacent internal electrodes is located inside so that the end thereof is not exposed on the other side face where the external electrode is formed, with the other internal electrode has the end thereof exposed on the other end face.

Then a groove is formed in the side face of the stack, whereon the ends of the internal electrodes are exposed alternately, toward the end of the internal electrode that is not exposed, with the groove being filled with a dielectric material such as resin or rubber of which Young's modulus is lower than that of the piezoelectric material. While the first embodiment shows a preferred example where the groove is formed, it is not necessarily required to form the groove according to the present invention.

Then an electrically conductive silver-glass paste is prepared by adding a binder to a glass powder, with the mixture being formed into a sheet that is dried to remove solvent while controlling the density of the sheet in a range from 6 to 9 g/cm$^3$. The sheet is transferred onto the external electrode forming surface of the column-like stack 10, and is bonded by baking at a temperature that is higher than the softening point of the glass and is not higher than the melting point (965° C.) of silver and is 4/5 of the firing temperature (° C.) or lower. In this process, the binder contained in the sheet that is formed from the electrically conductive silver-glass paste is removed and the external electrode 4 is formed from a porous electrical conductor having 3-dimensional mesh structure.

The temperature at which the electrically conductive silver-glass paste is bonded by baking is preferably in a range from 550 to 700° C. for the purpose of forming an effective neck, joining silver that is contained in the electrically conductive silver-glass paste and the internal electrode 2 through diffusion, so as to effectively cause the voids in the external electrode 4 to remain and partially joining the external electrode 4 and the side face of the column-like stack 10. Softening point of the glass component contained in the electrically conductive silver-glass paste is preferably in a range from 500 to 700° C.

When the baking temperature is higher than 700° C., sintering of the silver powder of the electrically conductive silver-glass paste would proceed excessively, such that the porous electrical conductor of 3-dimensional mesh structure cannot be effectively formed. That is, the external electrode 4 becomes too dense, resulting in Young's modulus of the external electrode 4 that is too high to effectively absorb the stress generated during operation, eventually leading to breakage of the external electrode 4. Baking is preferably carried out at a temperature that is not higher than 1.2 times the softening point of the glass.

When the baking temperature is lower than 550° C., on the other hand, the end of the internal electrode 2 and the external electrode 4 cannot be joined sufficiently through diffusion, and therefore the neck cannot be formed thus resulting in spark occurring between the internal electrode 2 and the external electrode 4 during operation.

Thickness of the sheet formed from the electrically conductive silver-glass paste is preferably smaller than the thickness of the piezoelectric layer 1. More preferably, the thickness is 50 µm or less in order to accommodate the contraction and expansion of the actuator.

The electrically conductive material that constitutes the external electrode 4 is preferably silver that has low Young's modulus or an alloy that contains silver as the main component, in order to satisfactorily absorb the stress generated by the contraction and expansion of the actuator.

Then the column-shaped stack 10 having the external electrodes 4 formed thereon is immersed in a silicone rubber solution while deaerating the silicone rubber solution by evacuation, so as to fill the groove of the column-shaped stack 10 with the silicone rubber. Then the column-shaped stack 10 is pulled out of the silicone rubber solution and is coated with the silicone rubber on the side faces thereof. Then the silicon rubber that fills the groove and covers the side faces of the column-like stack 10 is hardened.

Then lead wires are connected to the external electrodes 4 thereby completing the multi-layer piezoelectric element of the present invention.

A DC voltage of 0.1 to 3 kV/mm is applied between the pair of external electrodes 4 via the lead wires so as to apply polarization treatment to the column-like stack 10, thereby to complete the multi-layer piezoelectric actuator as the product. When the lead wires of the multi-layer piezoelectric actuator are connected to an external voltage source and the voltage is supplied via the lead wires and the external electrodes 4 to the internal electrodes 2, the piezoelectric layers 1 undergo a significant amount of displacement by the reverse piezoelectric effect, so as to drive, for example, an automobile fuel injection valve that supplies fuel to an engine.

In the multi-layer piezoelectric element having the constitution described above, the metal composition contained in the internal electrodes 2 contains group VIII metal and group Ib metal as the main components, while contents of the group VIII metal and the group Ib metal are set so that proportion M1 (% by weight) of the group VIII metal and proportion M2 of the group Ib metal satisfy the relations $0<M1\leq15$, $85\leq M2<100$ and $M1+M2=100$, and therefore an actuator of high reliability can be provided where thermal excursion can be prevented even when operated continuously over a long period of time under high electric field.

In the multi-layer piezoelectric element having the constitution described above, resistance $\rho Ag$ of the device having the internal electrode 2 of which metallic component consists solely of silver, resistance $\rho Pd$ of the device of which metallic component consists solely of palladium and the resistance $\rho$ of the device satisfy the relation $\rho Ag<\rho<\rho Pd$, and therefore the amount of displacement does not substantially change even when the actuator is operated continuously over a long period of time under high electric field. Thus the piezoelectric actuator having excellent durability and high reliability without malfunction of the apparatus can be provided.

In the multi-layer piezoelectric element having the constitution described above, resistance $\rho Ag$ of the device having the internal electrode of which metallic component consists solely of silver, resistance $\rho Pd$ of the device of which metallic component consists solely of palladium and the resistance $\rho$ of the device satisfy the relation $\rho Ag<\rho<\rho Pd$, and therefore the amount of displacement does not substantially change even when the actuator is operated continuously over a long period of time under high electric field. Thus the piezoelectric actuator having excellent durability and high reliability without malfunction of the apparatus can be provided.

In the multi-layer piezoelectric element having the constitution described above, 80% by volume or more of crystal grains formed from the metallic component that constitutes the internal electrode 2 have grain size of 1 µm or larger. As a result, the amount of displacement does not substantially change even when the actuator is operated continuously over a long period of time under high electric field. Thus the piezoelectric actuator having excellent durability and high reliability without malfunction of the apparatus can be provided.

According to the present invention, an electrical conductivity assisting member made of an electrically conductive adhesive with a metal mesh or a mesh-like metal sheet embedded therein may be formed on the external surface of the external electrode 4. In this case, the electrical conductivity assisting member provided on the external surface of the external electrode 4 allows it to supply a large electric current to the actuator, thereby enabling it to draw a large current through the electrical conductivity assisting member even when operated at a high speed, thus reducing the current flowing in the external electrode 4. This makes it possible to prevent the external electrodes 4 from breaking due to localized heat generation, thus resulting in greatly improved reliability. Moreover, because the metal mesh or the mesh-like metal sheet is embedded in the electrically conductive adhesive, cracks can be prevented from occurring in the electrically conductive adhesive.

The metal mesh refers to a structure of entwined metal wires, and the mesh-like metal sheet refers to a metal sheet with a number of holes punched therethrough.

It is also preferable that the electrically conductive adhesive that constitutes the electrical conductivity assisting member is formed from polyimide resin that contains silver powder dispersed therein. By dispersing the silver powder that has low specific resistance in the polyimide resin that has high heat resistance, the electrical conductivity assisting member can maintain low resistivity and high bonding strength even when used at high temperatures. More preferably, the electrically conductive particles are non-spherical particles such as flakes or acicular particles. When the electrically conductive particles are non-spherical particles such as flakes or acicular particles, the electrically conductive particles can be firmly entwined with each other, thereby increasing the shear strength of the electrically conductive adhesive.

The multi-layer piezoelectric element of the present invention is not limited to constitutions described above, and various modifications may be made without deviating from the spirit of the present invention.

While an example where the external electrodes 4 are formed on the opposing side faces of the column-shaped stack 10 has been described above, a pair of external electrodes may be formed, for example, on adjacent side faces according to the present invention.

The multi-layer piezoelectric element of the first embodiment having the constitution described above can be applied, for example, to a fuel injection apparatus of automobile engine, liquid ejecting apparatus of ink jet printer or the like or a drive unit used in precision positioning device or vibration preventing device for an optical apparatus, or to sensor devices such as a sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like, and is also applicable to other purposes, as long as the piezoelectric characteristic is utilized.

Particularly because the multi-layer piezoelectric element of the first embodiment undergoes substantially no change in the amount of displacement during continuous operation, it can be applied to a fuel injection apparatus of automobile engine to prevent malfunction of the apparatus and provide an injection apparatus of excellent durability and high reliability.

Embodiment 2

The multi-layer piezoelectric element (multi-layer piezoelectric actuator) according to the second embodiment of the present invention is the multi-layer piezoelectric element of the first embodiment modified to constitute the internal electrode 2 and the external electrode 4 as described below.

In the multi-layer piezoelectric actuator of the second embodiment, the external electrode 4 is formed from an electrically conductive material containing silver as the main component and glass, and the internal electrode 2 contains an electrically conductive material and a piezoelectric material.

The proportion X (% by weight) of silver in the electrically conductive material of the internal electrode 2, the proportion Z (% by weight) of silver in the internal electrode 2 containing the electrically conductive material and the piezoelectric material and the proportion Y (% by weight) of silver in the external electrode 4 satisfy conditions of $X \geq 85$ and $0.9 \leq X/Y \leq 1.1$. This is because value of X less than 85% means higher weight proportion of palladium in the internal electrode 2 that makes it impossible to manufacture the multi-layer piezoelectric actuator at a low cost. When the ratio X/Y is less than 0.9, the content of silver contained in the internal electrode 2 is less than the content of silver contained in the external electrode 4, resulting in less cross diffusion of silver contained in the internal electrode 2 and in the external electrode 4 when the external electrode 4 is bonded by baking. This weakens the bonding strength between the internal electrode 2 and the external electrode 4 leading to lower durability of the multi-layer piezoelectric actuator. When the ratio X/Y is higher than 1.1, the content of silver contained in the external electrode 4 is less than the content of silver contained in the internal electrode 2, resulting in less cross diffusion of silver contained in the internal electrode 2 and in the external electrode 4 when the external electrode 4 is bonded by baking. This weakens the bonding strength between the internal electrode 2 and the external electrode 4 leading to lower durability of the multi-layer piezoelectric actuator.

When the proportion X (% by weight) of silver in the electrically conductive material of the internal electrode 2 and the proportion Y (% by weight) of silver in the external electrode 4 formed from an electrically conductive material containing silver as the main component and glass satisfy conditions of $X \geq 85$ and $0.9 \leq X/Y \leq 1.1$, in contrast, the use of expensive palladium in the internal electrode 2 can be reduced, and therefore the multi-layer piezoelectric actuator can be manufactured at a low cost. Also because the proportion X (% by weight) of silver in the internal electrode 2 is substantially equal to the proportion Y (% by weight) of silver in the external electrode 4, cross diffusion of silver contained in the internal electrode and in the external electrode is accelerated when the external electrode 4 is bonded by baking. This results in strong bonding between the internal electrode 2 and the external electrode 4. As a result, excellent durability is achieved such that the internal electrode 2 and the external electrode 4 do not break even when operated continuously over a long period of time under high electric field and high pressure.

It is more preferable that the internal electrode 2 consists of an electrically conductive material and a piezoelectric material and the proportion Z (% by weight) of silver in the internal electrode 2 satisfies condition of $0.7 \leq Z/Y \leq 1.0$, for the reason described below. When the ratio Z/Y is less than 0.7, the content of silver contained in the internal electrode 2 is less than the content of silver contained in the external electrode 4, resulting in higher resistance of the internal electrode 2 than that of the external electrode 4 and causing localized heat generation in the internal electrode 2. When the ratio Z/Y is higher than 1.0, the content of the piezoelectric material in the internal electrode 2 becomes smaller, resulting in weaker bonding between the internal electrode 2 and the piezoelectric material 1, eventually leading to peel-off between the internal electrode 2 and the piezoelectric material 1 in the interface thereof. Also because the content of silver contained in the external electrode 4 is less than the content of silver contained in the internal electrode 2, less cross diffusion of silver contained in the internal electrode and in the external electrode occurs thus resulting in weaker bonding strength between the internal electrode 2 and the external electrode 4.

Figure 2A:
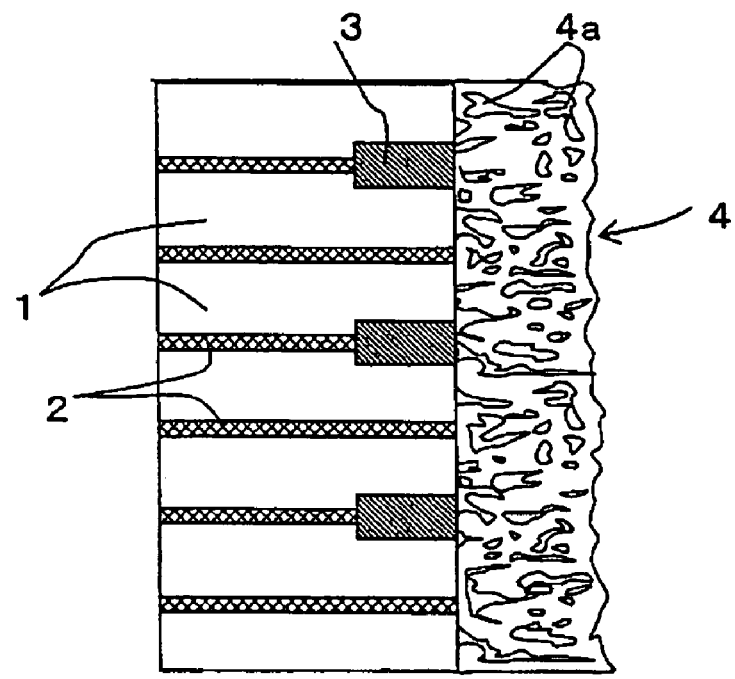
FIG. 2A is a sectional view showing enlarged part of FIG. 1B.
Figure 2B:
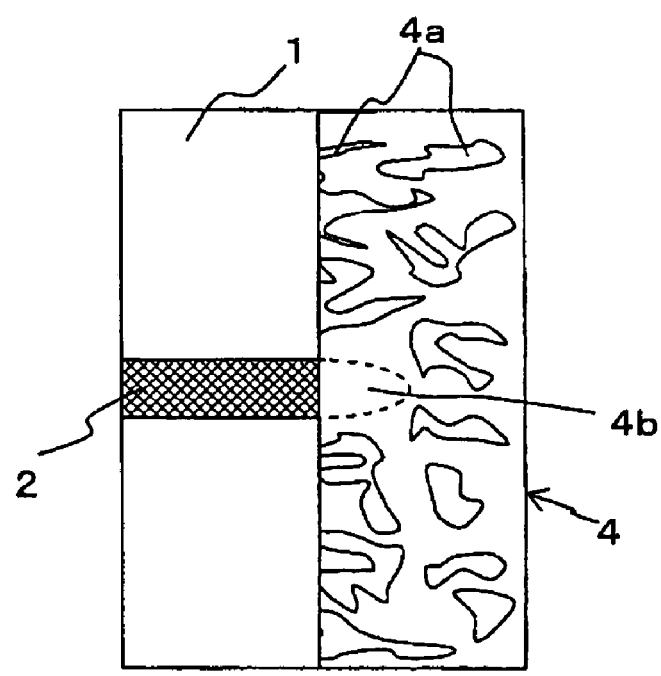
FIG. 2B is a sectional view showing enlarged part of FIG. 2A.

In the second embodiment, as shown in FIG. 2B, it is preferable that the external electrode 4 is joined through diffusion bonding with the end of the internal electrode 2 that is exposed on the side face of the stack, and the electrically conductive component of the internal electrode 2 diffuses into the external electrode 4 so as to form a neck 4b. The neck 4b enables it to form a strong joint between the internal electrode 2 and the external electrode 4. When the neck is formed at the end of the internal electrode and is embedded in the external electrode, it is made possible to prevent localized heat generation and spark from occurring in the joint between the internal electrode and the external electrode even when the multi-layer piezoelectric element is operated at a high speed with a large current.

In the second embodiment, it is preferable that the external electrode 4 is formed from a porous electrically conductive material having 3-dimensional mesh structure. The 3-dimensional mesh structure refers to such a condition of the material as an electrically conductive powder that constitutes the external electrode 4 and a glass powder are fired at a relatively low temperature so as to exist in such a state as sintering has not fully progressed with voids therein somewhat linked with each other, rather than a state where spherical voids are contained in the external electrode 4, and the electrically conductive powder that constitutes the external electrode 4 and the glass powder are bonded with each other in a 3-dimensional configuration. FIG. 2A is a sectional view showing enlarged part of FIG. 1B, and FIG. 2B is a sectional view showing enlarged part of FIG. 2A.

The external electrode 4 is preferably joined partially with the side face of the stack 10, in such a state as the external electrode 4 is joined through diffusion bonding with the end of the internal electrode 2 that is exposed on the side face of the stack 10 and is joined partially with the side face of the piezoelectric material 1 of the stack 10. That is, a part of the mixture of the electrically conductive material and glass is bonded with the side face of the piezoelectric material 1 and voids 4a are formed between the side face of the piezoelectric material 1 and the external electrode 4. A large number of voids 4a are formed also in the external electrode 4, thereby forming the external electrode from the porous electrically conductive material. The void 4a has such a complex shape as the powders of the electrically conductive material and glass retain the original shapes of the time before baking that remain substantially unaffected.

If the external electrode 4 is not formed from a porous electrically conductive material having 3-dimensional mesh structure, the external electrode 4 cannot show flexible property, and is unable to deform in conformity with the expansion and contraction of the multi-layer piezoelectric actuator, thus eventually resulting in breakage of the external electrode 4 or contact failure between the internal electrode and the external electrode.

According to the present invention, the external electrode 4 preferably contains 30 to 70% by volume of voids, so that the external electrode 4 can accommodate the stress caused by the expansion and contraction of the actuator. When the void ratio in the external electrode 4 is less than 30% by volume, the external electrode 4 may not be able to endure the stress caused by the expansion and contraction of the actuator, and may eventually break. When the void ratio in the external electrode 4 is higher than 70% by volume, on the other hand, resistance of the external electrode 4 becomes higher and the external electrode undergoes localized heating that leads to breakage if a large current flows.

It is also preferable that a glass-rich layer is formed on the surface of the external electrode 4 on the side facing the piezoelectric material 1. Without the glass-rich layer, it becomes difficult to bond with the glass component of the external electrode 4, thus making it difficult to form a strong bonding between the external electrode 4 and the piezoelectric material 1.

It is also preferable that the softening point (° C.) of the glass contained in the external electrode 4 is not higher than 4/5 of the melting point (° C.) of the electrically conductive material that constitutes the internal electrode 2 or lower. When the softening point of the glass is higher than 4/5 of the melting point of the electrically conductive material that constitutes the internal electrode 2, since softening point of the glass that constitutes the external electrode 4 becomes approximate to the melting point of the electrically conductive material that constitutes the internal electrode 2, baking temperature of the external electrode 4 becomes nearer to the melting point of the electrically conductive material that constitutes the internal electrode 2. This leads to coagulation of the electrically conductive materials of the internal electrode and the external electrode, thus making an obstacle to the diffusion bonding; and makes it difficult to set the baking temperature to a proper level for the glass component of the external electrode 4 to soften, thus making it unable to achieve sufficient strength of bonding with the glass.

It is also preferable that the glass that constitutes the external electrode 2 is amorphous. When the glass is crystalline, the external electrode 4 cannot accommodate the stress caused by the expansion and contraction of the multi-layer piezoelectric actuator, thus resulting in cracks or other defects.

It is also preferable that thickness of the external electrode 4 is smaller than that of the piezoelectric layer 1. When the external electrode is formed to be thicker than the piezoelectric layer 1, the external electrode 4 becomes stronger and gives rise to a possibility that load on the joint between the internal electrode and the external electrode increases when the stack 10 expands or contracts during operation, eventually resulting in contact failure in the joint.

Figure 2C:
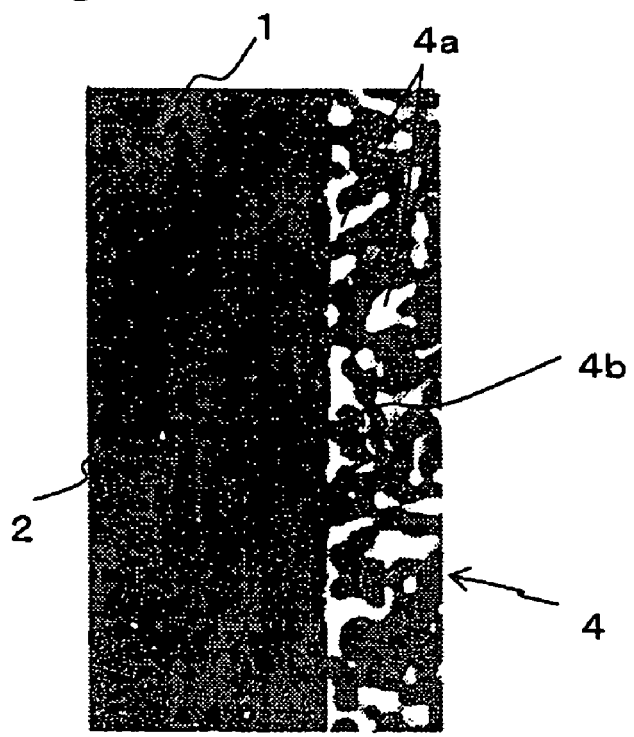
FIG. 2C is a photograph of the same section as shown in FIG. 2B.

It is also preferable that the groove formed in the side face of the stack 10 is filled with an insulating material 3 that has Young's modulus lower than that of the piezoelectric material 1, while the internal electrode and the external electrode are insulated in every other layer as shown in FIG. 2 and FIG. 3. While the piezoelectric material 1 interposed between the internal electrodes 2 expands and contracts according to a voltage applied between the adjacent internal electrodes 2, the piezoelectric material 1 located near the side face of the stack 10 that is not interposed between the internal electrodes 2 does not expand nor contract even when a voltage is applied across the internal electrodes 2. As a result, compressive stress or tensile stress is generated every time a voltage is applied across the internal electrodes 2. When the groove is formed in the side face of the stack 10 and is filled with the insulating material 3 that has Young's modulus lower than that of the piezoelectric material 1, on the other hand, stress generated in the side face of the stack 10 when the stack 10 expands or contracts can be mitigated by the expansion or contraction of the insulating material 3, thereby improving the durability.

When the insulating material 3 that fills the groove has Young's modulus higher than that of the piezoelectric material 1, stress generated near the side face of the stack 10 cannot be mitigated by the expansion or contraction of the insulating material 3, and therefore durability of the multi-layer piezoelectric element may become lower.

While the internal electrode 2 is preferably formed from a silver-palladium alloy having low palladium content for the reason of cost, for that purpose it is preferable to use the piezoelectric material 1 that can be fired at a temperature of about 980° C. or lower. The material that constitutes the piezoelectric layer 1 preferably contains $PbZrO_3$—$PbTiO_3$ as the main component and 10 to 20 mol % of $Pb(Yb_{1/2}Nb_{1/2})O_3$, $Pb(CO_{1/3}Nb_{2/3})O_3$ and $Pb(Zn_{1/3}Nb_{2/3})O_3$ as an auxiliary component. In case a silver-palladium alloy having palladium content of 5% by weight in the phase diagram of the silver-palladium alloy is used, a piezoelectric material that contains $PbZrO_3$—$PbTiO_3$ as the main component and 10 to 20 mol % of $Pb(Yb_{1/2}Nb_{1/2})O_3$, $Pb(Co_{1/3}Nb_{2/3})O_3$ and $Pb(Zn_{1/3}Nb_{2/3})O_3$ added thereto as an auxiliary component may be used as the piezoelectric layer 1 that can be fired at a temperature of about 980° C. or lower.

In case a silver-palladium alloy having palladium content of 5% by weight is used to form the internal electrode 2, melting point of the electrically conductive material (silver-palladium alloy) that constitutes the internal electrode 2 is exceeded when the internal electrode 2 is fired at 1100° C. This leads to coagulation of the electrically conductive material of the internal electrode 2, and may eventually results in delamination. In order to use a silver-palladium alloy having low palladium content as the electrically conductive material of the internal electrode 2, it is necessary to keep the firing temperature of the piezoelectric layer 1 to about 980° C. or lower.

The external electrode 4 is constituted from 87 to 99.5% by weight of electrically conductive material and 0.5 to 13% by weight of glass powder, with the small amount of glass dispersed in the electrically conductive material. The external electrode 4 is partially bonded with the side face of the stack 10. That is, the external electrode 4 is bonded to the end of the internal electrode 2 that is exposed on the side face of the stack 10 through diffusion of the electrically conductive material in the external electrode 4, and is bonded to the side face of the stack 10 mainly via the glass component contained in the external electrode 4. That is, a part of the mixture of the electrically conductive material and glass is bonded with the side face of the piezoelectric material 1 and voids 4a are formed between the side face of the piezoelectric material 1 and the external electrode 4. A large number of voids 4a are formed also in the external electrode 4, thereby forming the external electrode 4 from the porous electrically conductive material. The void 4a has such a complex shape as the powders of the electrically conductive material and glass retain the original shapes at a time before baking, that remain substantially unaffected.

The electrically conductive material of the external electrode 4 is preferably formed from silver that has low Young's modulus or an alloy containing silver as the main component in order to effectively absorb the stress generated by the expansion and contraction of the multi-layer piezoelectric actuator, and the external electrode 4 as a whole is preferably formed from a porous electrically conductive material having flexible 3-dimensional mesh structure.

The multi-layer piezoelectric actuator of the second embodiment can be manufactured similarly to the multi-layer piezoelectric actuator of the first embodiment.

First, the stack 10 is made similarly to the first embodiment.

The silver-palladium alloy used to form the internal electrode 2 is preferably one that contains low palladium content, particularly one that contains 10% by weight or less palladium for the reason of cost. For that purpose it is preferable to use the piezoelectric material 1 that can be fired at a temperature of about 980° C. or lower, and piezoelectric layer 1 that contains $PbZrO_3$—$PbTiO_3$ as the main component and 10 to 20 mol % of $Pb(Yb_{1/2}Nb_{1/2})O_3$, $Pb(CO_{1/3}Nb_{2/3})O_3$ and $Pb(Zn_{1/3}Nb_{2/3})O_3$ added as an auxiliary component may be used. Silver-palladium composition that constitutes the internal electrode may be either a powder of silver-palladium alloy or a mixture of silver powder and palladium powder. When a mixture of silver powder and palladium powder is used, too, silver-palladium alloy can be formed as well by firing.

Proportion of the piezoelectric material (calcined powder of piezoelectric ceramics) to be added to the electrically conductive paste when forming the internal electrode 2 is preferably such that the internal electrode 2 after firing contains 75 to 93% by weight of the electrically conductive material and 7 to 25% by weight of the piezoelectric material, in order to increase the bonding strength of the internal electrode 4 and the piezoelectric layer 1 and keep the resistance of the internal electrode 2 sufficiently low.

Method for manufacturing the stack 10 is not limited to that described above, and any method may be employed as long as the stack 10 can be formed in such a constitution as a plurality of piezoelectric layers 1 and a plurality of internal electrodes 2 are stacked alternately one on another.

Figure 3A:
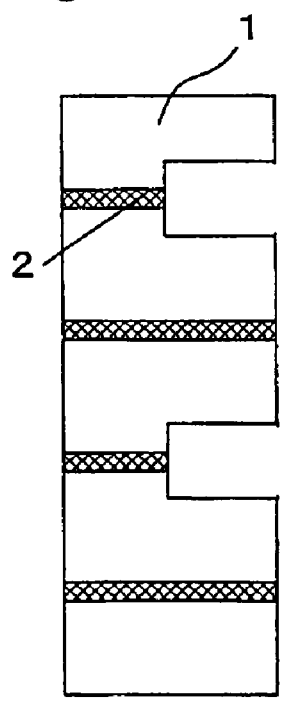
FIG. 3A is a sectional view showing a stage after forming a groove in a side face in a method for manufacturing the multi-layer piezoelectric element of the present invention.

After forming the stack 10, grooves are formed on the side face of the stack 10 in every other layer by a dicing apparatus or the like, as shown in FIG. 3A.

Figure 3B:
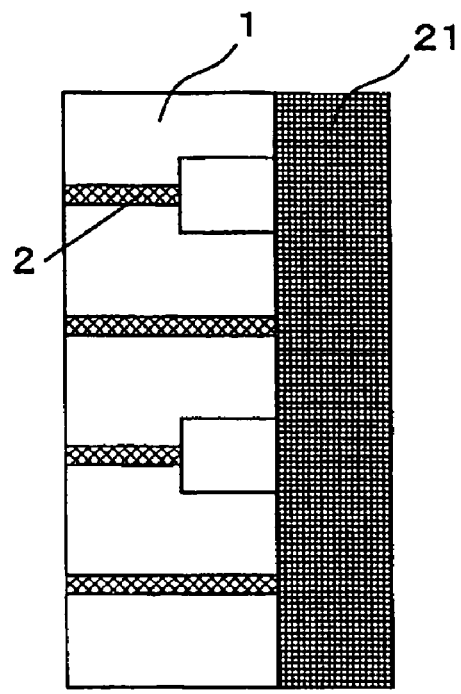
FIG. 3B is a sectional view showing a stage after forming an electrically conductive paste 21 on a side face in the method for manufacturing the multi-layer piezoelectric element of the present invention.

A binder is added to a mixture of 87 to 99.5% by weight of silver powder having particle size of 0.1 to 10 μm and 0.5 to 13% by weight of glass powder having softening point of 450 to 800° C. comprising silicon having particle size of 0.1 to 10 μm as the main component, so as to prepare electrically conductive silver-glass paste that is formed into a sheet and is dried to remove solvent while controlling the density of the green sheet 21 in a range from 6 to 9 g/cm$^3$. The sheet 21 is transferred onto the external electrode forming surface of the stack 10 having the grooves formed therein as shown in FIG. 3B, and is bonded by baking at a temperature that is higher than the softening point of the glass and is not higher than the melting point of silver, thereby to form the external electrode 4.

Figure 3C:
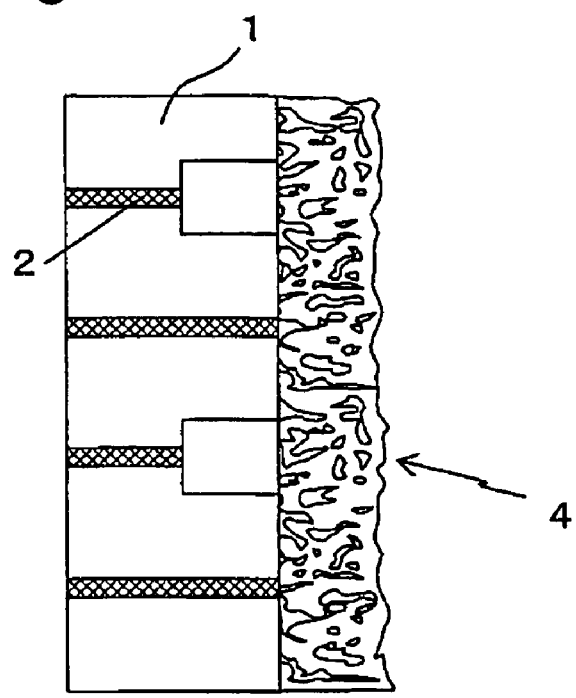
FIG. 3C is a sectional view showing a stage after forming the external electrode 4 on a side face in the method for manufacturing the multi-layer piezoelectric element of the present invention.

The external electrode 4 formed from the porous electrically conductive material having 3-dimensional mesh structure may also be made as the binder component is removed from the sheet 21 that is formed from the electrically conductive silver-glass paste as shown in FIG. 3C. In order to form the external electrode 4 having 3-dimensional mesh structure, in particular, density of the green sheet 21 is preferably controlled in a range from 6 to 9 g/cm$^3$. In order to achieve void ratio in the external electrode 4 in a range from 30 to 70%, density of the green sheet 21 is preferably controlled in a range from 6.2 to 7.0 g/cm$^3$. Density of the green sheet 21 can be measured by Archimedes method.

As the silver-glass paste is baked, the voids 4a are formed in the external electrode 4 while silver contained in the silver-glass paste may be combined through diffusion with the silver-palladium alloy contained in the internal electrode 2 so as to form the neck 4b, with the external electrode 4 being partially bonded onto the side face of the stack 10. In the neck 4b, because of cross diffusion of the silver-palladium alloy contained in the internal electrode 2 and silver contained in the external electrode 4, palladium that has diffused from the internal electrode 2 can be detected by a common analytical method (for example, EPMA, EDS, etc.).

Baking temperature of the electrically conductive silver-glass paste is preferably set in the range described in the first embodiment, in order to effectively form the neck 4b.

Thickness of the sheet 21 of the silver-glass paste is preferably smaller than that of the piezoelectric layer 1, and is more preferably 50 µm or less so as to deform in conformity with the expansion and contraction of the multi-layer piezoelectric actuator.

The reason for setting the composition of the electrically conductive silver-glass paste 21 in the range from 87 to 99.5% by weight of silver powder and 0.5 to 13% by weight of glass powder is as follows. When the content of the silver powder is less than 87% by weight, relatively high content of glass makes it impossible to effectively form the voids 4a in the external electrode 4 when it is baked and partially bond the external electrode 4 to the side face of the stack 10. When the content of the silver powder is higher than 97% by volume and 99.5% by weight, relatively low content of glass results in weaker bonding between the external electrode 4 and the stack 10, thus giving rise to the possibility of the external electrode 4 coming off the stack 10 during operation of the multi-layer piezoelectric actuator.

For the glass component contained in the external electrode 4, silica glass, soda-lime glass, lead alkali silicate glass, aluminoborosilicate glass, borosilicate glass, aluminosilicate glass, borate glass, phosphate glass, lead glass or the like may be used.

The borosilicate glass, for example, may contain 40 to 70% by weight of $SiO_2$, 2 to 30% by weight of $B_2O_3$, 0 to 20% by weight of $Al_2O_3$, 0 to 10% by weight in total of oxides of alkali earth metals such as MgO, CaO, SrO and BaO, and 0 to 10% by weight of alkali metal oxide. The borosilicate glass may contain 5 to 30% by weight of ZnO. ZnO has an effect of lowering the processing temperature of borosilicate glass.

Phosphate glass may contain 40 to 80% by weight of $P_2O_5$, 0 to 30% by weight of $Al_2O_3$, 0 to 30% by weight of $B_2O_3$, 0 to 30% by weight of ZnO, 0 to 30% by weight of oxides of alkali earth metals and 0 to 10% by weight of oxides of alkali metals.

The lead glass may contain 0 to 80% by weight of $PbO_3$, 0 to 80% by weight of 0 to 40% by weight of $Sio_2$, 0 to 30% by weight of $Bi_2O_3$, 0 to 20% by weight of $Al_2O_3$, 0 to 30% by weight of ZnO, 0 to 30% by weight of oxides of alkali earth metals and 0 to 10% by weight of oxides of alkali metals.

The multi-layer piezoelectric actuator of the second embodiment can be manufactured similarly to the first embodiment.

The stack 10 having the external electrodes 4 formed thereon is immersed in silicone rubber solution and is subjected to vacuum deaeration so as to fill the grooves of the stack 10 with the silicone rubber, and then the silicone rubber is hardened.

Lead wires 6 are connected to the external electrodes 4, and DC voltage of 0.1 to 3 kV/mm is applied between the pair of external electrodes 4 via the lead wires 6 so as to apply polarization treatment to the stack 10, thereby to complete the multi-layer piezoelectric actuator that functions as a fuel injection valve for supplying fuel to an automobile engine.

Embodiment 3

The multi-layer piezoelectric element (multi-layer piezoelectric actuator) according to the third embodiment of the present invention is the device shown in FIGS. 1A and 1B where the internal electrode 2 is made of an electrically conductive material containing silver as the main component and at least one of palladium and platinum, the external electrode 4 is made of an electrically conductive material containing silver as the main component and glass, and proportion of silver in the electrically conductive material that constitutes the internal electrode 2 located near the joint with the external electrode 4 is set higher than the proportion of silver in the electrically conductive material that constitutes the internal electrode 2 located inside of the stack 10.

By setting the proportion of silver in the electrically conductive material that constitutes the internal electrode 2 located near the joint with the external electrode 4 higher than the proportion of silver in the electrically conductive material that constitutes the internal electrode 2 located inside of the stack 10, it becomes possible to make the concentration of silver contained as the main component of the electrically conductive material of the external electrode 4 and concentration of silver in electrically conductive material of the internal electrode approximate to each other, thus making the bonding between the internal electrode 2 and the external electrode 4 more secure through cross diffusion of silver.

That is, since the concentration of silver contained as the main component in the electrically conductive material of the external electrode 4 and the concentration of silver in electrically conductive material of the internal electrode 2 become substantially equal to each other, cross diffusion of silver in the external electrode 4 and silver in the internal electrode is accelerated when the external electrode is bonded by baking onto the stack. This enables it to firmly join the internal electrode 2 and the external electrode 4, so that excellent durability is achieved such that internal electrode 2 and the external electrode 4 do not break even when operated continuously over a long period of time under high electric field and high pressure.

It is also preferable that the proportion of silver contained in the electrically conductive material of the internal electrode 2 becomes higher toward the external electrode 4. Since this arrangement results in a gradient of silver concentration that varies continuously toward the external electrode, stable internal electrode 2 and junction of internal electrode 2 and the external electrode 4 can be achieved.

It is also preferable that the internal electrode 2 and the external electrode 4 are bonded together by diffusion through the neck 4b. This enables it to prevent spark or breakage from occurring in the joint between the internal electrode 2 and the external electrode 4 even when the actuator is operated at a high speed with a large current, since the neck 4b that endures large current is formed in the junction between the internal electrode 2 and the external electrode 4. Also because the internal electrode 2 and the external electrode 4 are bonded together by diffusion through the neck 4b, there is no distinct border in the composition in the junction between the internal electrode 2 and the external electrode 4, so that the junction having high reliability can be formed. The neck 4b refers to the portion formed through cross diffusion of the electrically conductive material of the internal electrode 2 and the electrically conductive material of the external electrode 4.

By setting the silver content contained in the electrically conductive material of the internal electrode 2 to 85% or higher, it is made possible to form a reliable junction with the external electrode 4 through diffusion of silver by making use of high concentration of silver in the internal electrode 2. Also because the use of expensive materials such as palladium and platinum can be reduced by setting the silver content contained in the electrically conductive material of the internal electrode to 85% or higher, the multi-layer piezoelectric element can be manufactured at a lower cost. When the silver content in the electrically conductive material of the internal electrode 2 is lower than 85%, the use of expensive materials such as palladium and platinum inevitably increases and it becomes impossible to manufacture the multi-layer piezoelectric element at a lower cost. Also the low silver content in the electrically conductive material of the internal electrode 2 makes the junction with the external electrode 4 insecure. The proportion of silver contained in the electrically conductive material of the internal electrode 2 refers to the proportion of silver within the stack 10 at a position located 1 mm or more away from the junction with the external electrode 4 where the proportion of silver contained in the electrically conductive material of the internal electrode 2 does not vary.

It is also preferable that a glass-rich layer is formed on the surface of the external electrode 4 on the side thereof facing the piezoelectric layer 1. Having much glass component of the external electrode 4 located in the interface of bonding with the piezoelectric layer 1 improves the strength of joining the external electrode 4 and the side face of the stack 10.

Moreover, it is preferable that the glass component of the external electrode 4 exists in a region substantially not more than 80% in thickness of the external electrode 4 on the side of the surface of the stack 10. This results in such a constitution of the external electrode 4 that the glass component that supports the junction with the stack 10 exists near the surface on the side of the piezoelectric layer 1 and therefore achieves strong bonding between the external electrode 4 and the stack 10, while only the electrically conductive material that contains silver as the main component exists on the surface of the external electrode 4 exposed to the atmosphere, so that the external electrode 4 having a surface that is satisfactorily wetted by solder is provided when a lead wire is soldered onto the external electrode 4.

It is also preferable that the glass component of the external electrode 4 contains lead oxide or bismuth oxide. The external electrode 4 can be joined more firmly with the piezoelectric material when the glass component of the external electrode 4 contains lead oxide or bismuth oxide that can form strong junction with the piezoelectric layer 1. When the glass component of the external electrode 4 does not contain lead oxide or bismuth oxide, such a problem may occur as the external electrode 4 comes off the side face of the stack 10 during operation.

While the internal electrode 2 is preferably formed from a silver-palladium alloy having low palladium content for the reason of cost, for that purpose it is preferable to use the piezoelectric material 1 that can be fired at a temperature of about 980° C. or lower. The material that constitutes the piezoelectric layer 1 preferably contains $PbZrO_3$—$PbTiO_3$ as the main component and 10 to 20 mol % of $Pb(Yb_{1/2}Nb_{1/2})O_3$, $Pb(CO_{1/3}Nb_{2/3})O_3$ and $Pb(Zn_{1/3}Nb_{2/3})O_3$ as an auxiliary component. In case a silver-palladium alloy having palladium content of 5% by weight in the phase diagram of the silver-palladium alloy is used, a piezoelectric material that contains $PbZrO_3$—$PbTiO_3$ as the main component with 10 to 20 mol % of $Pb(Yb_{1/2}Nb_{1/2})O_3$, $Pb(CO_{1/3}Nb_{2/3})O_3$ and $Pb(Zn_{1/3}Nb_{2/3})O_3$ added thereto as an auxiliary component may be used as the piezoelectric layer 1 that can be fired at a temperature of about 980° C. or lower.

In case a silver-palladium alloy having palladium content of 5% by weight is used to form the internal electrode 2, melting point of the electrically conductive material (silver-palladium alloy) that constitutes the internal electrode 2 is exceeded when the internal electrode 2 is fired at 1100° C. This leads to coagulation of the electrically conductive material of the internal electrode 2 eventually resulting in delamination. In order to use a silver-palladium alloy having low palladium content as the electrically conductive material of the internal electrode 2, it is necessary to keep the firing temperature of the piezoelectric layer 1 to about 980° C. or lower.

The external electrode 4 consists of 80 to 99.5% by weight of the electrically conductive material that contains silver as the main component and 0.5 to 13% by weight of the glass component that contains lead oxide or bismuth oxide, while the glass component exists only in a region substantially not more than 80% in thickness of the external electrode 4 on the side of the surface of the stack 10. The external electrode 4 is bonded to the end of the internal electrode 2 that is exposed on the side face of the stack 10 through diffusion of the electrically conductive material in the external electrode 4, and is bonded to the side face of the stack 10 mainly via the glass component contained in the external electrode 4.

A method for manufacturing the multi-layer piezoelectric actuator comprising the multi-layer piezoelectric element of the present invention will now be described below.

According to this manufacturing method, the stack 10 is made similarly to the second embodiment, and grooves are formed one the side face of the stack 10 in every other layer by dicing apparatus or the like, as shown in FIG. 3A.

Then the external electrodes 4 are formed as follows.

87 to 99.5% by volume of silver powder having particle size in a range from 0.1 to 10 µm, 0.5 to 13% by volume of glass powder containing lead oxide or bismuth oxide having mean particle size in a range from 0.1 to 10 µm and a binder are mixed, so as to prepare a silver-glass paste for lower layer. A silver-glass paste for upper layer is prepared by adding a binder to silver powder having particle size in a range from 0.1 to 10 µm.

The silver-glass paste for lower layer 21a is applied to a release film by screen printing to a thickness of 5 to 40 µm. After drying, the silver-glass paste for lower layer 21b is applied thereto by screen printing to a thickness of 5 to 40 µm. After drying, the paste sheet 21 is peeled off the release film and is transferred onto the surface where the external electrode 4 is to be formed on the stack 10 that has the grooves formed thereon, so that the silver-glass paste for lower layer faces the stack 10. The external electrode 4 having the neck 4b formed thereon as shown in FIG. 3(c) is formed by baking at a temperature that is higher than the softening point of the glass contained in the silver-glass paste for lower layer and is not higher than the melting point of silver.

In order to effectively increase the silver content in the electrically conductive material of the internal electrode 2 toward the external electrode 4, integration with time (minute) of exponential function Y of temperature shown in equation 1 that represents the baking pattern of the external electrode 4 preferably gives a value of 1000 or more, preferably in a range from 1800 to 4000.

$$Y = exp((T+273)/273) \text{ (T is in ° C.)} \quad \text{(Equation 1)}$$

When integration of Y with time (minute) is in a range from 1800 to 4000, it is made possible to effectively increase the silver content in the electrically conductive material of the internal electrode toward the external electrode 4, form the neck 4b in the joint between the internal electrode 2 and the external electrode 4 and form the glass-rich layer is formed on the surface of the external electrode 4 on the side thereof facing the stack 10.

The glass-rich layer can be formed on the surface of the external electrode 4 on the side thereof facing the stack 10 by baking the paste sheet 21 comprising the silver-glass paste for lower layer that contains the glass component and the silver-glass paste for upper layer that does not contain the glass component so that the silver-glass paste for lower layer is located on the stack 10 side. By controlling the thickness of the silver-glass paste for lower layer and the silver-glass paste for upper layer that form the paste sheet 21, the glass component can be caused to exist only in a region substantially not more than 80% in thickness of the external electrode 4 on the side of the surface of the stack 10. Moreover, the neck 4b can be formed by the baking operation, and cross diffusion of silver-palladium alloy in the internal electrode 2 and silver in the external electrode 4 occurs in the neck 4b. Thus palladium that has diffused from the internal electrode 2 can be detected by a common analytical method (for example, EPMA, EDS, etc.).

Method for forming the external electrode 4 is not limited to that described above, and the paste may also be printed directly on the external electrode 4 forming surface of the side face of the stack 10. While the external electrode 4 is formed in a single baking operation, the external electrode 4 may also be formed in two baking operations, by transferring or printing and then baking the silver-glass paste for lower layer and transferring or printing and then baking the silver-glass paste for upper layer.

Thickness of the external electrode 4 is preferably smaller than that of the piezoelectric layer 1, and more preferably 50 μm or less so as to be capable of deforming in conformity with the expansion and contraction of the stack that constitutes the actuator.

The reason for setting the composition of the silver-glass paste for lower layer in a range from 80 to 99.5% by weight of silver powder and 0.5 to 13% by weight of glass powder is as follows. When the content of the silver powder is less than 80% by weight, the external electrode 4 has high specific resistance that causes the external electrode 4 to undergo localized heating that leads to breakage if a large current flows. When the content of the silver powder is higher than 99.5% by weight, relatively low content of glass results in weaker bonding between the external electrode 4 and the stack 10, thus giving rise to the possibility of the external electrode 4 to come off the stack 10 during operation.

The silver-glass paste for upper layer does not contain glass component. This is because, when the lead wire 6 is connected to the external electrode 4 by soldering, existence of glass component in the surface of the external electrode 4 exposed to the atmosphere leads to lower wettability to solder and lower strength of bonding between the lead wire 6 and the external electrode 4, thus eventually causing the lead wire 6 to come off during operation.

Strength of bonding with the stack 10 can be increased by containing at least one of lead oxide and bismuth oxide in the glass component of the silver-glass paste for lower layer.

The multi-layer piezoelectric actuator of the second embodiment can be manufactured similarly to the first embodiment.

The stack 10 having the external electrodes 4 formed thereon is immersed in silicone rubber solution and is subjected to vacuum deaeration so as to fill the grooves of the stack 10 with the silicone rubber, and then the silicone rubber is hardened.

Lead wires 6 are connected to the external electrodes 4, and DC voltage of 0.1 to 3 kV/mm is applied between the pair of external electrodes 4 via the lead wires 6 so as to apply polarization treatment to the stack 10, thereby to complete the multi-layer piezoelectric actuator that functions as a fuel injection valve for supplying fuel to an automobile engine.

In the first through third embodiments described above, the piezoelectric layer 1 is formed from a piezoelectric ceramic material constituted from perovskite type oxide such as lead titanate zirconate Pb(Zr, Ti) $O_3$ (hereinafter abbreviated as PZT) or barium titanate $BaTiO_3$ as the main component. The piezoelectric ceramic material preferably has high value of piezoelectric strain constant d33 which represents the piezoelectric characteristics.

In the first through third embodiments, thickness of the piezoelectric layer 1, namely the distance between the internal electrodes 2, is preferably in a range from 50 to 250 μm. This makes it possible to make the actuator smaller with low profile and prevent insulation breakdown of the piezoelectric layer 1 from occurring, even when a larger number of layers are stacked so as to achieve a greater amount of displacement of the multi-layer piezoelectric actuator by applying a voltage.

In the first through third embodiments, it is preferable that the internal electrode 2 includes voids, and that the voids occupy 5 to 70% of cross sectional area of the internal electrode 2 (this proportion will be hereinafter referred to as void ratio).

The multi-layer piezoelectric element having high durability can be obtained by constituting the multi-layer piezoelectric element from the internal electrodes 2 that include voids. When void ratio in the internal electrode 2 is less than 5%, the restriction exercised on the deformation of the piezoelectric material becomes higher resulting in insufficient effect of the voids. When void ratio in the internal electrode 2 is higher than 70%, the internal electrode 2 has lower electrical conductivity and lower strength. In order to improve the durability of the device, void ratio in the internal electrode 2 is preferably in a range from 7 to 70%, and more preferably in a range from 10 to 60% which enables it to achieve larger amount of displacement and higher durability.

The void ratio in the internal electrode 2 refers to the proportion of area occupied by the voids in the cross sectional area of the internal electrode 2, and can be determined in a procedure described below.

In a longitudinal section of the multi-layer piezoelectric element cut along a direction parallel to the stacking direction, total cross sectional area of the internal electrode 2 exposed in the longitudinal section and the area occupied by the voids are measured under a microscope. From these areas, void ratio in the internal electrode 2 is calculated as ((area occupied by voids/total cross sectional area)×100).

The internal electrode 2 that includes the voids can be manufactured as follows.

First, metal powder that constitutes the internal electrode 2 is prepared from two or more kinds of materials having different melting points so that voids are formed in the internal electrode 2 after firing. An alloy may be used as the metallic material depending on the purpose.

The metal powder that constitutes the internal electrode 2 is calcined at a temperature that is not lower than that of the metal having the lowest melting point and is not higher than that of the metal having the highest melting point among the metal powder that constitutes the internal electrode 2. When calcined at such a temperature, metal or alloy among the metal powder that constitutes the internal electrode 2 that has been melted moves between metal particles that have not been melted by capillary effect thus leaving voids behind. This method allows it to set the void ratio in the internal electrode 2 to a desired level by proportions and temperature of the metal powder that constitutes the internal electrode 2.

The voids in the internal electrode 2 may also be formed by making use of small clearance that is formed between the metal powder particles when controlling the electrically conductive paste used in forming the internal electrode 2, or by making use of clearance that is formed as the binder contained in the electrically conductive paste is burned out.

Alternatively, the voids in the internal electrode 2 may also be formed by adding a material, that has low wettability with regards to the materials that constitute the internal electrode 2, to the electrically conductive paste used in forming the internal electrode 2, or by coating the green sheet of the piezoelectric material, whereon the electrically conductive paste of the internal electrode 2 is to be printed, with a material that has low wettability with regards to the materials that constitute the internal electrode 2. For the material that has low wettability with regards to the materials that constitute the internal electrode 2, for example, BN can be used.

Figure 4A:
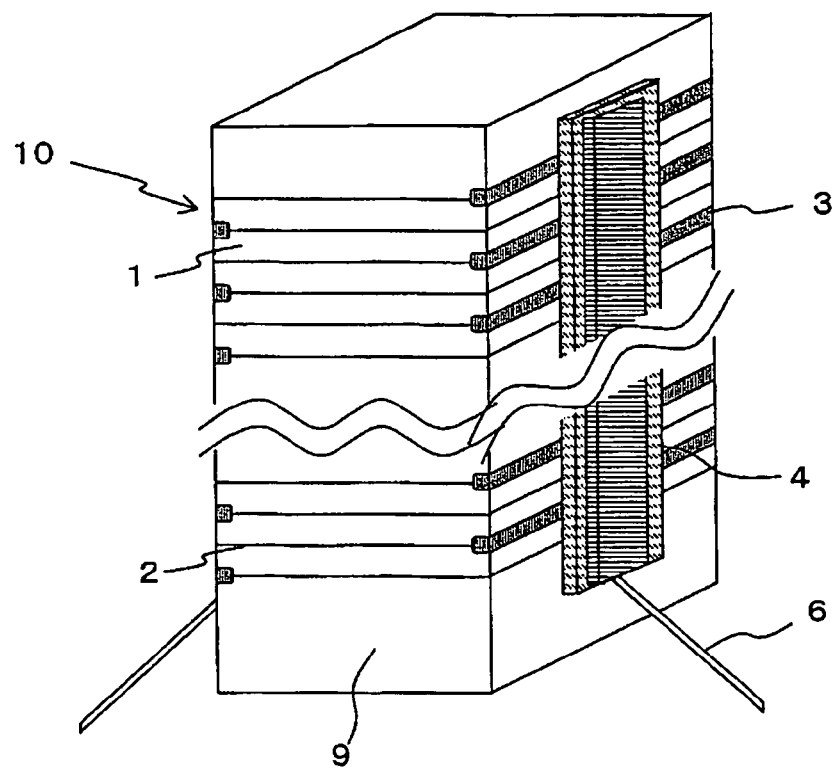
FIG. 4A is a perspective view of the multi-layer piezoelectric element according to the present invention where an electrically conductive assisting member is formed on the external surface of the external electrode.
Figure 4B:
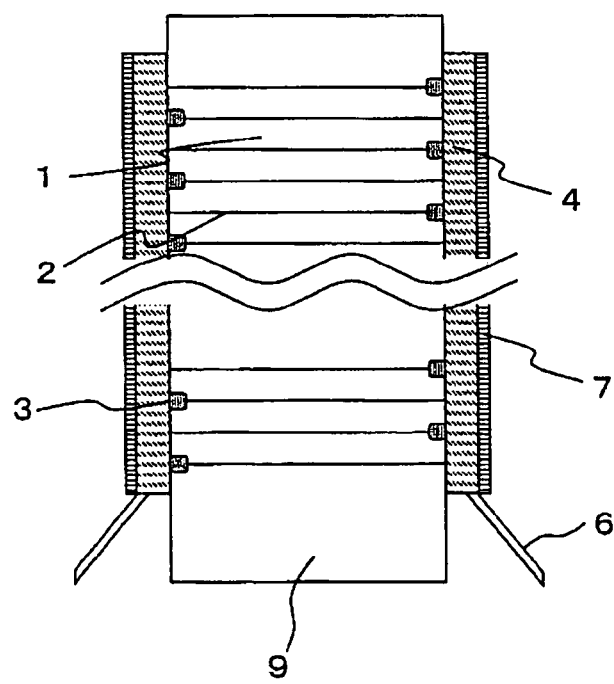
FIG. 4B is a sectional view of FIG. 4B.
Figure 4C:
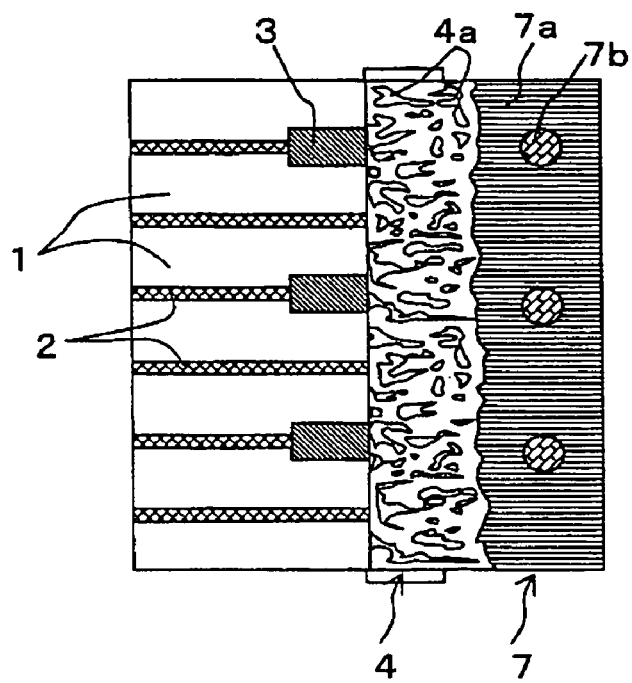
FIG. 4C is a sectional view showing enlarged part of FIG. 4B.

In the first through third embodiments, an electrical conductivity assisting member 7 made of an electrically conductive adhesive 7a with a metal mesh or a mesh-like metal sheet 7b embedded therein may be formed on the external surface of the external electrode 4 as shown in FIG. 4. In this case, the electrical conductivity assisting member provided on the external surface of the external electrode 4 allows it to supply a large electric current to the actuator, thereby enabling it to draw a large current through the electrical conductivity assisting member 7 even when operated at a high speed, thus reducing the current flowing in the external electrode 4. This makes it possible to prevent the external electrodes 4 from breaking due to localized heat generation, thus resulting in greatly improved reliability. Moreover, because the metal mesh or the mesh-like metal sheet 7b is embedded in the electrically conductive adhesive 7a, cracks can be prevented from occurring in the electrically conductive adhesive 7a.

In case a metal mesh or a mesh-like metal sheet is not used on the surface of the external electrode 4, the stress generated by the expansion and contraction of the stack 10 acts directly onto the external electrode 4, thus giving rise to the possibility of the external electrode 4 coming off the side face of the stack 10 due to fatigue during operation.

The metal mesh refers to a structure of entwined metal wires, and the mesh-like metal sheet refers to a metal sheet with a number of holes punched therethrough.

It is preferable that the electrically conductive adhesive is formed from polyimide resin that contains electrically conductive particles dispersed therein. Use of the polyimide resin that has high heat resistance makes it easier to maintain high bonding strength even when the stack 10 is used at high temperatures.

It is further preferable that the electrically conductive adhesive 7a that constitutes the electrically conductive assisting member 7 is formed from polyimide resin that contains silver powder which has low specific resistance dispersed therein. This is because the use of silver powder which has low specific resistance as the electrically conductive particles makes it easier to suppress the localized heat generation in the electrically conductive adhesive.

Furthermore, it is preferable that the electrically conductive particles are non-spherical particles such as flakes or acicular particles. When the electrically conductive particles are non-spherical particles such as flakes or acicular particles, the electrically conductive particles can be firmly entwined with each other, thereby increasing the shear strength of the electrically conductive adhesive 7a.

Embodiment 4

Figure 5:
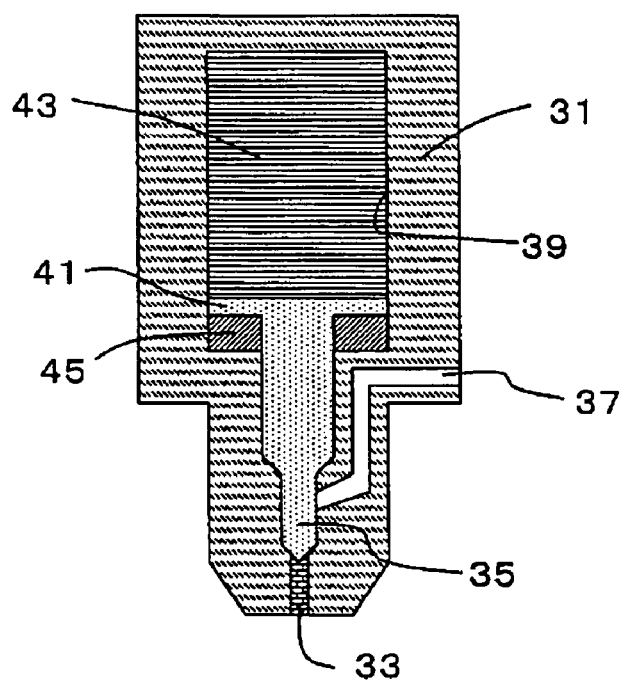
FIG. 5 is a sectional view showing the constitution of an injection apparatus according to fourth embodiment of the present invention.
Figure 6:
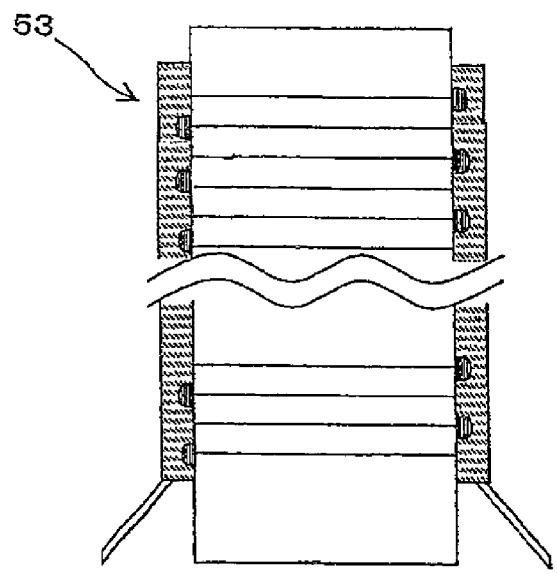
FIG. 6 is a sectional view of a multi-layer piezoelectric actuator of the prior art.
Figure 7:
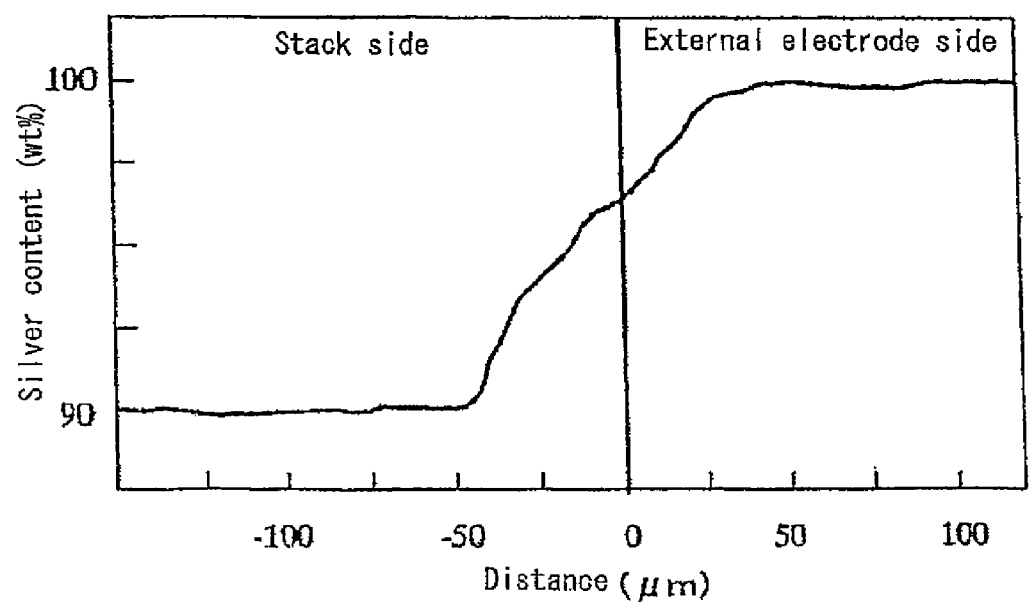
FIG. 7 is a graph showing the proportion of silver content in electrically conductive material of the internal electrode according to the fourth embodiment of the present invention.
Figure 8A:
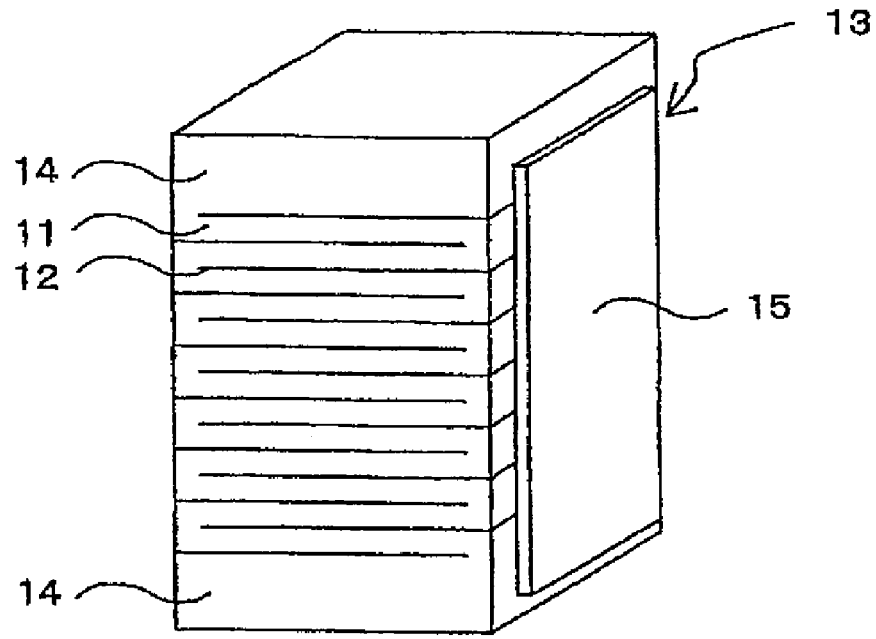
FIG. 8A is a perspective view showing the constitution of multi-layer piezoelectric element of the prior art.
Figure 8B:
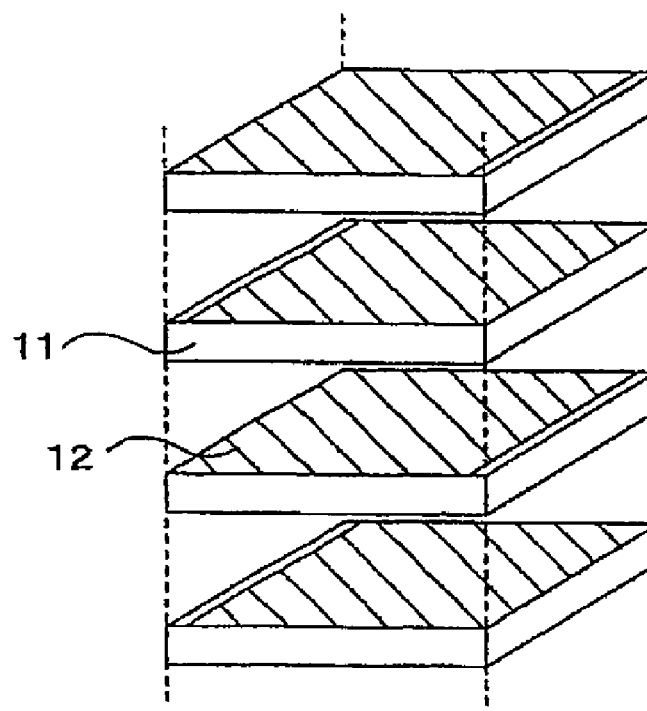
Figure 9:
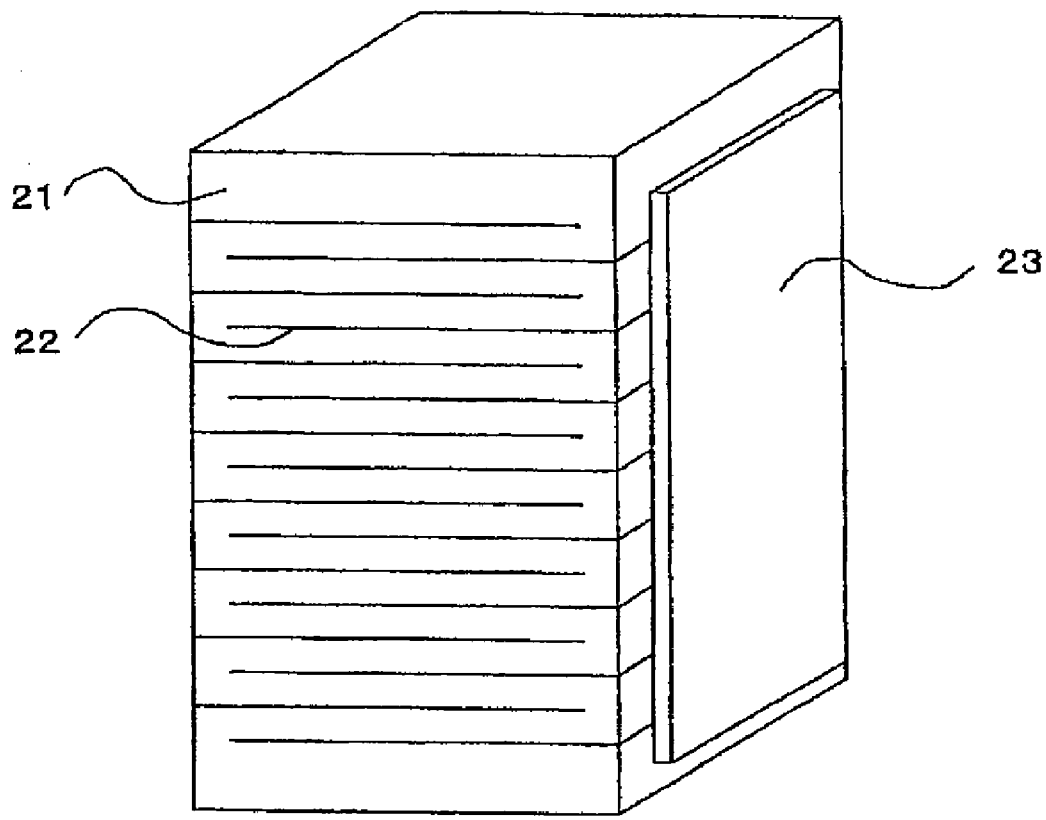
FIG. 9 is a perspective view showing the constitution of a multi-layer capacitor as a typical multi-layer piezoelectric element of the prior art.

FIG. 5 is a sectional view showing the constitution of an injection apparatus according to fourth embodiment of the present invention, constituted from the piezoelectric actuator of the present invention. In FIG. 5, reference numeral 31 denotes a container. The container 31 has an injection hole 33 formed at one end thereof, and a needle valve 35 housed therein to open and close the injection hole 33.

The injection hole 33 is provided with a fuel passage 37 in communication therewith. The fuel passage 37 is connected to a fuel source that is provided outside of the apparatus, so as to receive supply of fuel at a constant pressure. When the needle valve 35 opens the injection hole 33, the fuel that fills the fuel passage 37 is injected at a predetermined level of high pressure into a fuel chamber of an internal combustion engine that is not shown in the drawings.

The needle valve 35 has an enlarged top portion of large diameter so as to serve as a piston 41 that makes sliding motion in a cylinder 39 formed in the container 31. The piezoelectric actuator 43 is housed in the container 31. The piezoelectric actuator 43 is the piezoelectric actuator of the present invention.

With the injection apparatus as described above, when the piezoelectric actuator 43 is caused to expand by a voltage applied thereto, the piston 41 is pressed so that the needle valve 35 plugs the injection hole 33 and shuts off the fuel supply. When the voltage is removed, the piezoelectric actuator 43 contracts and a Belleville spring 45 presses back the piston 41 so that the injection hole 33 communicates with the fuel passage 37 thereby allowing the fuel to be injected.

With this injection apparatus, since the internal electrode and the external electrode of the multi-layer piezoelectric element can be prevented from breaking and durability can be greatly improved as described in the first through third embodiments, durability of the injection apparatus can also be improved.

EXAMPLE 1

In Example 1, the multi-layer piezoelectric element shown in FIG. 1 was made as described below. The multi-layer piezoelectric element comprising internal electrodes formed with different compositions were tested to determine the durability of the multi-layer piezoelectric element having different displacement characteristics.

First, a column-shaped stack was made, with the piezoelectric layers formed from lead titanate zirconate ($PbZrO_3$—$PbTiO_3$) having thickness of 150 µm and the internal electrodes having thickness of 3 µm, by stacking 300 layers each of the piezoelectric layers and the internal electrodes. The stack was fired at 1000° C.

Then a groove measuring 50 µm in depth and 50 µm width was formed at the end of the internal electrode on the side face of the column-shaped stack in every other layer by a dicing apparatus.

Then 90% by volume of silver powder of flake-like particles having mean particle size of 2 µm and 10% by volume of amorphous glass powder having softening point of 640° C. containing silicon as the main component having mean particle size of 2 µm were mixed, and 8 weight parts of a binder was added for 100 weight parts in total of the silver powder and the glass powder, so as to prepare the electrically conductive silver-glass paste by fully mixing the powders. The electrically conductive silver-glass paste thus prepared was screen printed onto a release film. After drying, the paste film was peeled off the release film to obtain a sheet of electrically conductive silver-glass paste. Density of the green sheet as measured by Archimedes method was 6.5 g/cm$^3$.

The sheet of electrically conductive silver-glass paste was transferred onto the external electrode surface of the column-shaped stack and was baked at 650° C. for 30 minutes, thereby forming the external electrode from the porous electrically conductive material having 3-dimensional mesh structure. Measurement of void ratio of the external electrode by means of image analysis apparatus on a photograph of a cut surface of the external electrode showed a void ratio of 40%.

Then lead wires were connected to the external electrodes, and DC electric field of 3 kV/mm was applied between the positive and negative external electrodes via the lead wires so as to apply polarization treatment for 15 minutes, thereby to complete the multi-layer piezoelectric element as shown in FIG. 1.

When a DC voltage of 170 V was applied to the multi-layer piezoelectric element, it underwent a displacement of 45 μm in the direction of stacking. Operation test was conducted on this multi-layer piezoelectric element by applying an AC voltage varying between 0 V and +170 V at frequency of 150 Hz at room temperature.

Change in the amount of displacement of the multi-layer piezoelectric element after undergoing $1 \times 10^9$ cycles of operation was measured while varying the composition of the internal electrode, and was compared with the displacement of the multi-layer piezoelectric element in the initial state, so as to calculate the variation of the amount of displacement and deterioration of the multi-layer piezoelectric element. The results are shown in Table 1.

Table 1

TABLE 1-1

| No. | Pd (% by weight) | Pt (% by weight) | Ag (% by weight) | Cu (% by weight) |
|---|---|---|---|---|
| *1 | 0 | 0 | 100 | 0 |
| 2 | 0.001 | 0 | 99.999 | 0 |
| 3 | 0.01 | 0 | 99.99 | 0 |
| 4 | 0.1 | 0 | 99.9 | 0 |
| 5 | 0.5 | 0 | 99.5 | 0 |
| 6 | 1 | 0 | 99 | 0 |
| 7 | 2 | 0 | 98 | 0 |
| 8 | 4 | 1 | 95 | 0 |
| 9 | 5 | 0 | 95 | 0 |
| 10 | 8 | 0 | 92 | 0 |
| 11 | 9 | 0 | 91 | 0 |
| 12 | 9.5 | 0 | 90.5 | 0 |
| 13 | 10 | 0 | 90 | 0 |
| 14 | 15 | 0 | 85 | 0 |
| 15 | 0.001 | 0 | 0 | 99.999 |
| *16 | 20 | 0 | 80 | 0 |
| *17 | 30 | 0 | 70 | 0 |
| *18 | 100 | 0 | 0 | 0 |

The contents of Pd, Pt, Ag and Cu are shown in the columns under the heading of Pd, Pt, Ag and Cu, respectively, in Table 1-1.

TABLE 1-2

| No. | Change (%) in displacement after $1 \times 10^9$ cycles of operation |
|---|---|
| *1 | Broken due to migration |
| 2 | 0.7 |
| 3 | 0.7 |
| 4 | 0.4 |
| 5 | 0.2 |
| 6 | 0.2 |
| 7 | 0 |
| 8 | 0 |
| 9 | 0 |
| 10 | 0 |
| 11 | 0.2 |
| 12 | 0.2 |
| 13 | 0.4 |
| 14 | 0.7 |
| 15 | 0.2 |
| *16 | 0.9 |
| *17 | 0.9 |
| *18 | 0.9 |

From Table 1-1 and Table 1-2, it can be seen that the multi-layer piezoelectric element where the internal electrode (No. 1) formed from 100% silver could not be operated continuously due to breakage caused by silver migration, while the multi-layer piezoelectric element (Nos. 2 through 15) where the internal electrode was formed with such a composition as the proportion M1 (% by weight) of the group VIII metal (Pd, Pt) and the proportion M2 of the group Ib metal (Ag, Cu) satisfied the relations 0<M1≦15, 85≦M2<100 and M1+M2=100 were capable of providing piezoelectric actuator having excellent durability and high reliability without malfunction of the apparatus. With regards to improvement in durability of the multi-layer piezoelectric element, in particular, satisfactory results were obtained when M1 was 0.1% by weight or higher and not higher than 10% by weight (Nos. 4 through 13), and M1 is more preferably 0.5% by weight or higher and not higher than 9.5% by weight (Nos. 7 through 10) when even higher durability is required. M2 is preferably 90% by weight or higher and not higher than 99.9% by weight in order to achieve high durability of the multi-layer piezoelectric element, and more preferably 90.5% by weight or higher and not higher than 99.5% by weight when even higher durability is required. When further higher durability is required, M2 is more preferably in a range from 92 to 98.

EXAMPLE 2

In Example 2, resistance was measured by applying DC voltage of 10 V across the external electrode of the devices made in Example 1 (except for device No. 15). Results of the measurements are shown in Table 2. The voltage applied to the device for the measurement of resistance may be selected in a range from 1 to 100 V.

TABLE 2

| No. | Resistance (Ω) | Normalized resistance |
|---|---|---|
| *1 | $2.4 \times 10^8$ | 1.0 |
| 2 | $3.0 \times 10^8$ | 1.3 |
| 3 | $3.1 \times 10^8$ | 1.3 |
| 4 | $3.4 \times 10^8$ | 1.4 |
| 5 | $4.0 \times 10^8$ | 1.7 |
| 6 | $5.0 \times 10^8$ | 2.1 |
| 7 | $5.7 \times 10^8$ | 2.4 |
| 8 | $5.6 \times 10^8$ | 3.6 |
| 9 | $1.0 \times 10^9$ | 4.2 |
| 10 | $1.45 \times 10^9$ | 6.0 |
| 11 | $1.58 \times 10^9$ | 6.6 |
| 12 | $1.65 \times 10^9$ | 6.9 |
| 13 | $1.72 \times 10^9$ | 7.2 |
| 14 | $2.3 \times 10^9$ | 9.6 |
| *16 | $2.88 \times 10^9$ | 12.0 |
| *17 | $4.6 \times 10^9$ | 19.2 |
| *18 | $2.4 \times 10^9$ | 10.0 |

Normalized resistance shown in Table 2 refers to the measured resistance of a device divided by the resistance of a device of which internal electrode is formed from 100% silver.

The above table shows that by controlling the resistance ρ of the device to satisfy the relation ρAg<ρ<ρPd, the amount of displacement of the piezoelectric actuator can be stabilized by suppressing the device temperature from increasing, and piezoelectric actuator having excellent durability and high reliability can be provided.

EXAMPLE 3

In Example 3, electrical conductivity of the internal electrode was measured on the devices made in Example 1 (except for device No. 15). Results of the measurements are shown in Table 3.

TABLE 3

| No. | Electrical conductivity of the internal electrode (S · cm$^{-1}$) | Normalized electrical conductivity of the internal electrode |
| --- | --- | --- |
| *1 | 600000 | 1.00 |
| 2 | 475000 | 0.76 |
| 3 | 455000 | 0.76 |
| 4 | 415000 | 0.69 |
| 5 | 360000 | 0.60 |
| 6 | 290000 | 0.48 |
| 7 | 250000 | 0.42 |
| 8 | 170000 | 0.28 |
| 9 | 140000 | 0.24 |
| 10 | 100000 | 0.17 |
| 11 | 90000 | 0.15 |
| 12 | 86000 | 0.14 |
| 13 | 83500 | 0.14 |
| 14 | 62500 | 0.10 |
| *16 | 50000 | 0.08 |
| *17 | 31000 | 0.05 |
| *18 | 61000 | 0.10 |

The above table shows that heat generation from the internal electrode can be suppressed even when operated continuously so as to stabilize the amount of displacement of the piezoelectric actuator by controlling the electrical conductivity σ of the internal electrode to satisfy the relation σAg<σ<σPd, and piezoelectric actuator having excellent durability and high reliability can be provided.

EXAMPLE 4

In Example 4, particle size in the internal electrode was evaluated on the devices made in Example 1 (except for device No. 15). Results of the measurements are shown in Table 4.

Data shown in Table 4 are proportions of particles contained in the internal electrode having sizes not smaller than 1 μm.

TABLE 4

| No. | Volume proportion (%) of particles having sizes 1 μm or larger in internal electrode |
| --- | --- |
| *1 | 70 |
| 2 | 80 |
| 3 | 80 |
| 4 | 85 |
| 5 | 90 |
| 6 | 90 |
| 7 | 95 |
| 8 | 95 |
| 9 | 95 |
| 10 | 95 |
| 11 | 90 |
| 12 | 90 |
| 13 | 85 |
| 14 | 80 |
| *16 | 70 |
| *17 | 70 |
| *18 | 70 |

The above table shows that, when 80% by volume or more of crystal grains formed from the metallic component that constitutes the internal electrode is 1 μm or larger, heat generation from the internal electrode can be suppressed even when operated continuously. Moreover, the amount of displacement of the piezoelectric actuator can be stabilized by suppressing the device temperature from increasing, and piezoelectric actuator having excellent durability and high reliability can be provided.

The present invention is not limited to the Example described above, and various modifications can be made to an extent that does not deviate from the scope of the present invention.

EXAMPLE 5

In Example 5, the multi-layer piezoelectric element of the present invention was made as described below.

First, a slurry was prepared by mixing a calcined powder of piezoelectric ceramics containing PZT as the main component, a binder and a plasticizer, and the slurry was formed into a ceramic green sheet that would become the piezoelectric layer 1 having thickness of 150 μm by doctor blade method.

Then an electrically conductive paste, prepared by adding a binder to the silver-palladium alloy comprising a mixture of 85 to 95% by weight of silver and palladium, was applied to one side of the ceramic green sheet to a thickness of 3 μm by screen printing process. Then 300 pieces of the ceramic green sheets were stacked and fired at a temperature of 980 to 11000° C., thereby to obtain the stack 10 shown in FIG. 1.

Then a groove measuring 50 μm in depth and 50 μm in width was formed at the end of the internal electrode 2 located on the side face of the stack 10 in every other layer, by means of a dicing apparatus, as shown in FIG. 3A.

Then 84 to 97% by weight of silver powder of flake-like particle shape having mean particle size of 2 μm and amorphous glass powder having softening point of 640° C. containing silicon as the main component having mean particle size of 2 μm were mixed, and 8 weight parts of a binder was added for 100 weight parts in total of the silver powder and the glass powder, so as to prepare the electrically conductive silver-glass paste by mixing the powders. The electrically conductive silver-glass paste thus prepared was screen printed onto a release film. After drying, the paste film was peeled off the release film to obtain a sheet of the electrically conductive silver-glass paste. The sheet of electrically conductive silver-glass paste was transferred onto a pair of opposing side faces of the stack 10 and was bonded by baking at 650° C. for 30 minutes, thereby forming the external electrode 4.

In the junction between the internal electrode and the external electrode, the neck 4b is formed through cross diffusion of the silver-palladium alloy contained in the internal electrode 2 and silver contained in the electrically conductive silver-glass paste of the external electrode 4. Analysis of the neck 4b by EPMA showed that palladium had diffused from the internal electrode 2.

Measurement on a section photograph of the external electrode 4 showed that void ratio in the internal electrode 2 formed as described above was 40%. Further measurement on section photograph of the external electrode 4 showed that void ratio in the junction between the external electrode 4 and the side face of the stack 10 was about 50%. It was also found that a glass-rich layer was formed on the surface of the external electrode 4 on the piezoelectric layer side wherein the glass component of the electrically conductive silver-glass paste was concentrated.

Then lead wires were connected to the external electrodes, and DC electric field of 3 kV/mm was applied between the positive and negative external electrodes via the lead wires so as to apply polarization treatment for 15 minutes, thereby to complete the multi-layer piezoelectric actuator as shown in FIG. 1.

In the multi-layer piezoelectric actuator of the present invention made as described above, the proportion X (% by weight) of silver in the electrically conductive material of the internal electrode 2 and the proportion Y (% by weight) of silver in the external electrode were controlled to satisfy conditions of X≧85, and the operation of the multi-layer piezoelectric actuator was studied in relation to the value of X/Y.

As comparative examples, samples were made with the value of X/Y controlled to satisfy X/Y<0.9 or X/Y>1.1.

When a DC voltage of 185 V was applied to the multi-layer piezoelectric actuator that was made as described above, displacement of 49 µm was observed in the direction of stacking in all of the multi-layer piezoelectric actuators. Operation test was conducted on these multi-layer piezoelectric actuators by applying an AC voltage varying between 0 V and +185 V at frequency of 150 Hz at room temperature to undergo $2\times10^8$ cycles of operation. The results are shown in Table 5.

TABLE 5

| Sample No. | Proportion X of silver by weight in internal electrode | Proportion Y of silver by weight in external electrode | Ratio X/Y | Evaluation (After 2 × $10^8$ cycles) |
|---|---|---|---|---|
| 19 | 95 | 97 | 0.98 | No abnormality |
| 20 | 95 | 86.5 | 1.1 | No abnormality |
| 21 | 88 | 97.5 | 0.9 | No abnormality |
| *22 | 85 | 97 | 0.83 | Amount of displacement decreased. |
| *23 | 95 | 84 | 1.13 | Amount of displacement decreased. |

From Table 5, it can be seen that, in sample No. 22 that was a comparative example where the value of X/Y was less than 0.9 resulting in the silver content in the internal electrode 2 lower than that of the external electrode 4 and higher melting point of the internal electrode 2 due to less silver content in the internal electrode 2, less cross diffusion of silver between the internal electrode 2 and the external electrode 4 occurred leading to lower strength of the neck 4b. As a result, when the multi-layer piezoelectric actuator was operated continuously at a high speed, the neck 4b was broken due to the stress generated by the expansion and contraction of the stack 10 thus shutting off the current supply to part of the piezoelectric layers 1. Consequently, the amount of displacement of the stack 10 decreased as the number of operation cycles increased, thus showing lower durability of the multi-layer piezoelectric actuator.

In sample No. 23 that was a comparative example where value of X/Y was higher than 1.1 resulting in the silver content in the external electrode 4 lower than the silver content in the electrically conductive material of the internal electrode, less cross diffusion of silver between internal electrode and the external electrode occurred. As a result, the neck 4b was broken due to the stress generated by the expansion and contraction of the stack 10 thus shutting off the current supply to part of the piezoelectric layers 1, similarly to the sample described above. Consequently, the amount of displacement of the stack 10 decreased as the number of operation cycles increased, thus showing lower durability of the multi-layer piezoelectric actuator.

In samples Nos. 19 through 21 that were multi-layer piezoelectric actuators of the present invention where silver content was controlled so as to satisfy the conditions of X≧85 and 0.9≦X/Y≦1.1, cross diffusion of silver between the internal electrode 2 and the external electrode 4 was accelerated so as to form firm bonding between the internal electrode 2 and the external electrode 4. As a result, displacement of 49 µm was observed after $2\times10^8$ cycles of operation and no trouble such as spark or breakage was observed in the external electrode $2\times10^8$ cycles of operation. Thus the multi-layer piezoelectric actuator showed excellent durability.

EXAMPLE 6

In Example 6, multi-layer piezoelectric actuators were made by using the internal electrodes 2 formed from an electrically conductive paste prepared by adding calcined powder of piezoelectric material to the silver-palladium alloy, while controlling the proportion Z (% by weight) of silver in the internal electrode 2 containing the electrically conductive material and the piezoelectric material, the proportion Y (% by weight) of silver in the external electrode 4 and the proportion X (% by weight) of silver in the internal electrode 2, and operation of the multi-layer piezoelectric actuator was checked in relation to the value of Z/Y. Manufacturing method was similar to that of Example 5.

When a DC voltage of 185 V was applied to the multi-layer piezoelectric actuator made as described above, displacement of 49 µm was observed in the direction of stacking in all samples. Operation test was conducted on these multi-layer piezoelectric actuators by applying an AC voltage varying within a range from 0 V and +185 V at frequency of 150 Hz at room temperature to undergo $5\times10^8$ cycles of operation. The results are shown in Table 6.

TABLE 6

| Sample No. | Proportion Z of silver by weight in internal electrode | Proportion Y of silver by weight in external electrode | Ratio Z/Y | Evaluation (After 5 × $10^8$ cycles) |
|---|---|---|---|---|
| 24 | 80 | 97 | 0.82 | No abnormality |
| 25 | 86.5 | 86.8 | 1 | No abnormality |
| 26 | 68.5 | 97.5 | 0.7 | No abnormality |
| 27 | 90 | 84 | 1.07 | Amount of displacement decreased. |
| 28 | 63 | 96 | 0.66 | Amount of displacement decreased from start. |

From Table 6, it can be seen that, in sample No. 27 where value of Z/Y was higher than 1.0 resulting in less content of the piezoelectric material in the internal electrode 2 and weaker bonding between the internal electrode 2 and the piezoelectric layer 1. As a result, part of the internal electrode 2 and the piezoelectric layer 1 peeled off thus shutting off the current supply to part of the piezoelectric layers 1. Consequently, the amount of displacement decreased.

In sample No. 28 where value of Z/Y was less than 0.7 resulting in less content of the silver in the internal electrode 2 and higher resistance of the external electrode 4 than that of the internal electrode 2. As a result, when operated continuously with a high frequency, the piezoelectric layer 1 could not be supplied with sufficient voltage due to the voltage drop caused by the high resistance of the internal electrode, and the amount of displacement decreased.

In samples Nos. 24 through 26, displacement of 49 µm was observed after $5\times10^8$ cycles of operation and no trouble such as breakage in the junction between internal electrode and the external electrode was observed.

EXAMPLE 7

The multi-layer piezoelectric actuator comprising the multi-layer piezoelectric element of the present invention was made as described below.

First, the stack 10 shown in FIG. 1 was made similarly to Example 5, and a groove measuring 50 μm in depth and 50 μm in width was formed at the end of the internal electrode 2 located on the side face of the stack 10 in every other layer, by means of a dicing apparatus, as shown in FIG. 3A.

Then 80 to 99.5% by weight of silver powder having mean particle size of 2 μm and glass powder containing at least one of lead oxide and bismuth oxide having mean particle size of 2 μm were mixed, and a binder was added so as to prepare the silver-glass paste for lower layer. The silver-glass paste for upper layer was prepared similarly by adding a binder to the silver powder having mean particle size of 2 μm.

The silver-glass paste for lower layer was applied to a release film by screen printing to a thickness of 5 to 40 μm. After drying, the silver-glass paste for upper layer was applied thereto by screen printing to a thickness of 5 to 40 μm. After drying, the paste sheet was peeled off the release film and was transferred onto the pair of opposing side faces of the stack 10 so that the silver-glass paste for lower layer faces the surface of the stack 10, and was baked at 800° C. for 30 minutes, thereby forming the external electrode 4. Integration of Y in equation 1 with time (minute) gave a value of 3240.

Quantitative analysis of elements in the internal electrode 2 was conducted along line X shown in FIG. 2B by EPMA. It was found that silver content in the electrically conductive material of the internal electrode 2 gradually increased from a point 50 μm short of the junction with the external electrode 4 toward the junction with the external electrode 4 as shown in FIG. 5.

In the joint between the internal electrode 2 and the external electrode 4, the neck 4b was formed through cross diffusion of the silver-palladium alloy contained in the internal electrode 2 and silver contained in the external electrode 4. Analysis of the neck 4b by EPMA showed that palladium had diffused from the internal electrode 2.

It was also found that a glass-rich layer was formed on the surface of the external electrode 4 on the piezoelectric layer side wherein the glass component was concentrated. The glass component existed in a region substantially not more than 60% in thickness of the external electrode 4 on the side of the surface of the stack 10.

Then lead wires were connected to the external electrodes, and DC electric field of 3 kV/mm was applied between the positive and negative external electrodes via the lead wires so as to apply polarization treatment for 15 minutes, thereby to complete the multi-layer piezoelectric actuator as shown in FIG. 1.

EXAMPLE 8

In Example 8, several kinds of multi-layer piezoelectric actuator were made by a manufacturing method similar to that of Example 7, except for altering the kind of electrically conductive paste used to form the external electrode 4 and the temperature of baking thereof. The multi-layer piezoelectric actuator thus obtained was analyzed to determine the ratio of silver content in the vicinity of the junction between the electrically conductive material of the internal electrode and the external electrode 4 to silver content in the stack 10. When a DC voltage of 185 V was applied to the multi-layer piezoelectric actuator made as described above, displacement of 49 μm was observed in the direction of stacking in all of the multi-layer piezoelectric actuators. Operation test was conducted on these multi-layer piezoelectric actuators by applying an AC voltage varying between 0 V and +185 V at frequency of 150 Hz at room temperature to undergo $2\times10^8$ cycles of operation. The results are shown in Table 7.

TABLE 7

| Sample No. | Proportion of silver in internal electrode | | Ratio of silver content (E/I) | Evaluation (After 2 × $10^8$ cycles) |
| --- | --- | --- | --- | --- |
| | Inside stack (I %) | Near junction with external electrode (E %) | | |
| 29 | 95 | 98 | 1.03 | No abnormality |
| 30 | 85 | 95 | 1.12 | No abnormality |
| *31 | 95 | 95 | 1.00 | Amount of displacement decreased. |

From Table 7, it can be seen that in sample No. 31, where the ratio of silver content in the vicinity of the junction between the electrically conductive material of the internal electrode 2 and the external electrode 4 to silver content in the stack 10 is not higher than 1, that is, the silver content in the vicinity of the junction between the electrically conductive material of the internal electrode 2 and the external electrode 4 is not higher than the silver content in the electrically conductive material of the internal electrode 2 inside of the stack 10, bonding in the junction between the internal electrode and the external electrode is weak. As a result, part of the junction between the internal electrode 2 and the external electrode 4 comes off leading to failure of power supply to part of the piezoelectric layers 1 and lower displacement characteristic.

In samples Nos. 29 and 30 that are examples of the present invention, where the silver content in the electrically conductive material of the internal electrode in the vicinity of the junction with the external electrode 4 is higher than the silver content in the electrically conductive material of the internal electrode 2 inside of the stack 10, bonding in the junction between the internal electrode 2 and the external electrode 4 is strong and displacement of 49 μm was achieved after $2\times10^8$ cycles. Moreover, no trouble such as spark or breakage was observed in the external electrode $2\times10^8$ cycles of operation. Thus the multi-layer piezoelectric actuator showed excellent durability.

EXAMPLE 9

In Example 9, several kinds of multi-layer piezoelectric actuator were made while varying the kind of electrically conductive paste used to form the external electrode 4 and the temperature of baking thereof. Sample No. 16 did not have glass-rich layer on the surface of the external electrode 4 facing the surface of the stack 10, and sample No. 17 contained glass component in a region up to 95% of the thickness of the external electrode 4 from the surface of the stack. When a DC voltage of 185 V was applied to the multi-layer piezoelectric actuator made as described above, displacement of 49 μm was observed in the direction of stacking in all of the multi-layer piezoelectric actuator. Operation test was conducted on these multi-layer piezoelectric actuators by applying an AC voltage varying between 0 V and +185 V at frequency of 150 Hz at room temperature to undergo $5\times10^8$ cycles of operation. The results are shown in Table 8.

TABLE 8

| Sample No. | Glass-rich layer | Distribution of glass component | Evaluation (After 5 × $10^8$ cycles) |
|---|---|---|---|
| 32 | Present | Within 60% | No abnormality |
| 33 | Present | Within 80% | No abnormality |
| *34 | None | Within 60% | Amount of displacement decreased. |
| *35 | Present | Within 95% | Lead wire came off. |

From Table 8, it can be seen that, in sample No. 34 that did not have glass-rich layer on the surface of the external electrode 4 facing the surface of the stack 10, bonding in the junction between the external electrode 4 and the stack 10 was weak. As a result, the external electrode 4 came off the stack 10 during operation, leading to failure of power supply to part of the piezoelectric layers 1 and lower displacement characteristic. In sample No. 35 where glass component existed in a region up to 95% of the thickness of the external electrode 4 from the surface of the stack, bonding of the solder that fastened the lead wire 6 onto the external electrode 4 was weak, and the lead wire 6 came off during operation.

In samples Nos. 32 and 33, displacement of 49 μm was achieved after $5\times10^8$ cycles of operation, and no trouble such as breakage of the junction between the internal electrode 2 and the external electrode 4 occurred.

INDUSTRIAL APPLICABILITY

The multi-layer piezoelectric element of the present invention can be used as a piezoelectric transducer. The multi-layer piezoelectric element of the present invention can also be used as a multi-layer piezoelectric actuator for fuel injection apparatus of automobile engine, drive unit used in precision positioning device or vibration preventing device for an optical apparatus or the like. The multi-layer piezoelectric element of the present invention can also be used for liquid injection apparatus for automobile fuel and ink of ink jet printer or the like.

The invention claimed is:

1. A multi-layer piezoelectric element comprising a stack formed by stacking piezoelectric layers and internal electrodes alternately one on another and external electrodes formed on a first side face and on a second side face of the stack, one of the adjacent internal electrodes being connected to the external electrode formed on the first side face and the other internal electrode being connected to the external electrode formed on the second side face, wherein the metal composition contained in the internal electrodes contains silver as the main component and at least one of palladium and platinum, and contents of silver as the main component and at least one of palladium and platinum are set so that proportion M1 (% by weight) of at least one of palladium and platinum and proportion M2 (% by weight) of silver satisfy the relations $0<M1\leq15$, $85\leq M2<100$ and $M1+M2=100$, wherein the external electrodes being made of a conductive material including silver as a main component and glass, wherein the proportion of silver contained in electrically conductive material of the internal electrode near the junction with the external electrode is higher than the proportion of silver contained in electrically conductive material of the internal electrode located inside of the stack.

2. The multi-layer piezoelectric element according to claim 1;

wherein 80% by volume or more of crystal grains formed from the metallic component that constitutes the internal electrode have particle size of 1 μm or larger.

3. The multi-layer piezoelectric element according to claim 1;

wherein an inorganic component is contained along with the metallic component in the internal electrode.

4. The multi-layer piezoelectric element according to claim 3;

wherein the inorganic component contains perovskite type oxide consisting of $PbZrO_3$—$PbTiO_3$ as the main component.

5. The multi-layer piezoelectric element according to claim 1;

wherein the piezoelectric material contains perovskite type oxide as the main component.

6. The multi-layer piezoelectric element according to claim 5;

wherein the piezoelectric material contains perovskite type oxide consisting of $PbZrO_3$—$PbTiO_3$ as the main component.

7. The multi-layer piezoelectric element according to claim 1;

wherein the temperature of firing the stack is in a range from 900 to 1000° C.

8. The multi-layer piezoelectric element according to claim 1;

wherein the deviation in the composition of the internal electrode that is caused by the firing operation is 5% or less.

9. The multi-layer piezoelectric element according to claim 1;

wherein the external electrode is formed from an electrically conductive material consisting mainly of silver and glass, and wherein proportions of silver contained in the internal electrode and the external electrode are set so that the proportion X (% by weight) of silver contained in the electrically conductive material as a whole and the proportion Y (% by weight) of silver to the total weight of the electrically conductive material and glass contained in the external electrode satisfy conditions of $X\geq85$ and $0.9\leq X/Y\leq1.1$.

10. The multi-layer piezoelectric element according to claim 9;

wherein the internal electrode contains piezoelectric material, and wherein the proportion Z (% by weight) of silver to the total weight of the internal electrode containing the piezoelectric material satisfies condition of $0.7\leq Z/Y\leq1.0$.

11. The multi-layer piezoelectric element according to claim 9;

wherein the external electrode is formed from a porous electrically conductive material that has 3-dimensional mesh structure.

12. The multi-layer piezoelectric element according to claim 9;

wherein void ratio of the external electrode is in a range from 30 to 70% by volume.

13. The multi-layer piezoelectric element according to claim 9;
   wherein the softening point (° C.) of the glass used in the external electrode is not higher than ⅘ of the melting point (° C.) of the electrically conductive material that constitutes the internal electrode.

14. The multi-layer piezoelectric element according to claims 13;
   wherein the glass that constitutes the external electrode is amorphous.

15. The multi-layer piezoelectric element according to claim 9;
   wherein a thickness of the external electrode is smaller than a thickness of the piezoelectric layer that constitutes the stack.

16. The multi-layer piezoelectric element according to claim 1;
   wherein the proportion of silver contained in electrically conductive material of the internal electrode becomes higher toward the external electrode.

17. The multi-layer piezoelectric element according to claim 1;
   wherein the proportion of silver contained in the electrically conductive material of the internal electrode is 85% by weight or higher.

18. The multi-layer piezoelectric element according to claim 1;
   wherein the glass component is contained in a region substantially not more than 80% in thickness of the external electrode on the side of the surface of the stack.

19. The multi-layer piezoelectric element according to claim 1;
   wherein the glass component contained in the external electrode contains lead oxide or bismuth oxide.

20. The multi-layer piezoelectric element according to claim 1;
   wherein the electrically conductive material of the internal electrode diffuses into the external electrode so as to form a neck in the joint between the internal electrode and the external electrode.

21. The multi-layer piezoelectric element according to claim 1;
   wherein a glass-rich layer is formed on the surface of the external electrode on the side thereof facing the piezoelectric layer.

22. The multi-layer piezoelectric element according to claim 1;
   wherein a groove is formed between the end of the other internal electrode and the external electrode on the first side face, with the groove being filled with an insulating material and a groove is formed between the end of the one internal electrode and the external electrode on the second side face, with the groove being filled with an insulating material, the insulating material having Young's modulus lower than that of the piezoelectric material.

23. The multi-layer piezoelectric element according to claim 1; further comprising an electrically conductive assisting member formed from an electrically conductive adhesive, containing a metal mesh or a mesh-like metal sheet embedded therein, on the external surface of the external electrode.

24. The multi-layer piezoelectric element according to claim 23;
   wherein the electrically conductive adhesive is polyimide resin having electrically conductive particles dispersed therein.

25. The multi-layer piezoelectric element according to claim 24;
   wherein the electrically conductive particles are silver particles.

26. A multi-layer piezoelectric element comprising a stack formed by stacking piezoelectric layers and internal electrodes alternately one on another and external electrodes formed on a first side face and on a second side face of the stack, one of the adjacent internal electrodes being connected to the external electrode formed on the first side face and the other internal electrode being connected to the external electrode formed on the second side face,
   wherein the metal composition contained in the internal electrodes contains group VIII metal and group Ib metal of the periodic table as the main components, and contents of the group VIII metal and the group Ib metal are set so that proportion M1 (% by weight) of the group VIII metal and proportion M2 (% by weight) of the group Ib metal satisfy the relations $0<M1\leq15$, $85\leq M2<100$ and $M1+M2=100$,
   wherein the internal electrode contains voids and the voids occupy 5 to 70% of cross sectional area of the internal electrode.

* * * * *